United States Patent
Tseng et al.

(10) Patent No.: US 11,862,594 B2
(45) Date of Patent: Jan. 2, 2024

(54) PACKAGE STRUCTURE WITH SOLDER RESIST UNDERLAYER FOR WARPAGE CONTROL AND METHOD OF MANUFACTURING THE SAME

(71) Applicant: Taiwan Semiconductor Manufacturing Co., Ltd., Hsinchu (TW)

(72) Inventors: Ting-Chen Tseng, Hsinchu (TW); Hung-Jui Kuo, Hsinchu (TW); Yu-Hsiang Hu, Hsinchu (TW); Sih-Hao Liao, New Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 50 days.

(21) Appl. No.: 16/718,213

(22) Filed: Dec. 18, 2019

(65) Prior Publication Data
US 2021/0193605 A1    Jun. 24, 2021

(51) Int. Cl.
*H01L 21/768* (2006.01)
*H01L 23/522* (2006.01)
(Continued)

(52) U.S. Cl.
CPC ............ *H01L 24/14* (2013.01); *H01L 21/561* (2013.01); *H01L 23/28* (2013.01);
(Continued)

(58) Field of Classification Search
CPC ... H01L 21/561; H01L 24/14; H01L 23/4952; H01L 23/5226; H01L 2224/10121–09;
(Continued)

(56) References Cited

U.S. PATENT DOCUMENTS 6,221,972 B1 * 4/2001 Nakamura ......... C08G 59/1433
522/904
8,993,380 B2    3/2015 Hou et al.
(Continued)

OTHER PUBLICATIONS

Chandrasekharan Nair et al., "Reliability Studies of Excimer Laser-Ablated Microvias Below 5 Micron Diameter in Dry Film Polymer Dielectrics for Next Generation, Panel-Scale 2.5D Interposer RDL", May 2018, Conference paper pp. 1-6 (Year: 2018).*
(Continued)

*Primary Examiner* — Marcos D. Pizarro
*Assistant Examiner* — Tenley H Schofield
(74) *Attorney, Agent, or Firm* — JCIPRNET

(57) ABSTRACT

A package structure includes a semiconductor die, conductive pillars, an insulating encapsulation, a redistribution circuit structure, and a solder resist layer. The conductive pillars are arranged aside of the semiconductor die. The insulating encapsulation encapsulates the semiconductor die and the conductive pillars, and the insulating encapsulation has a first surface and a second surface opposite to the first surface. The redistribution circuit structure is located on the first surface of the insulating encapsulation. The solder resist layer is located on the second surface of the insulating encapsulation, wherein a material of the solder resist layer includes a filler.

20 Claims, 17 Drawing Sheets

(51) Int. Cl.
*H01L 23/00* (2006.01)
*H01L 23/31* (2006.01)
*H01L 23/495* (2006.01)
*H01L 23/528* (2006.01)
*H01L 23/532* (2006.01)
*H01L 23/367* (2006.01)
*H01L 25/065* (2023.01)
*H01L 23/28* (2006.01)
*H01L 21/56* (2006.01)

(52) U.S. Cl.
CPC ........ *H01L 23/4952* (2013.01); *H01L 23/528* (2013.01); *H01L 23/5226* (2013.01); *H01L 24/94* (2013.01)

(58) Field of Classification Search
CPC . H01L 2224/13023; H01L 2224/13024; H01L 2224/13025; H01L 2224/13008; H01L 2224/13009; H01L 2224/11011; H01L 2224/11013; H01L 23/528; H01L 24/94; H01L 23/49816; H01L 24/19; H01L 24/92; H01L 24/96; H01L 23/5389; H01L 2224/04105; H01L 2224/73209
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2005/0067688 A1* | 3/2005 | Humpston | H01L 24/82 257/704 |
| 2008/0064792 A1* | 3/2008 | Hwang | H05K 1/0373 523/466 |
| 2010/0096738 A1* | 4/2010 | Simmons-Matthews | H01L 21/76898 257/737 |
| 2011/0308849 A1* | 12/2011 | Kondo | H01L 23/49827 174/260 |
| 2014/0001583 A1* | 1/2014 | Teh | B81B 3/0005 257/417 |
| 2014/0015131 A1* | 1/2014 | Meyer | H01L 21/561 257/738 |
| 2015/0163908 A1* | 6/2015 | Wang | H05K 3/4007 174/262 |
| 2015/0318226 A1* | 11/2015 | Baek | H01L 23/14 257/731 |
| 2016/0100482 A1* | 4/2016 | Kunieda | H05K 3/4007 174/257 |
| 2016/0276284 A1* | 9/2016 | Chen | H01L 24/19 |
| 2016/0276325 A1* | 9/2016 | Nair | H01L 25/105 |
| 2017/0352626 A1* | 12/2017 | Lin | H01L 21/486 |
| 2018/0026010 A1* | 1/2018 | Huang | H01L 23/5386 257/659 |
| 2018/0102322 A1* | 4/2018 | Kang | H01L 23/5389 |
| 2018/0286823 A1* | 10/2018 | Tai | H01L 24/96 |
| 2018/0301389 A1* | 10/2018 | Liu | H01L 25/105 |
| 2020/0028239 A1* | 1/2020 | So | H01Q 1/2283 |
| 2020/0335443 A1* | 10/2020 | Sun Zhou | H01L 21/4857 |

OTHER PUBLICATIONS

Raman Thiagarajan, "Assessment of the Mechanical Integrity of Cu/low-k Dielectric in a Flip Chip Package" Dec. 2012, Masters Thesis, The University of Texas at Arlington (Year: 2012).*

* cited by examiner

PACKAGE STRUCTURE WITH SOLDER RESIST UNDERLAYER FOR WARPAGE CONTROL AND METHOD OF MANUFACTURING THE SAME

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
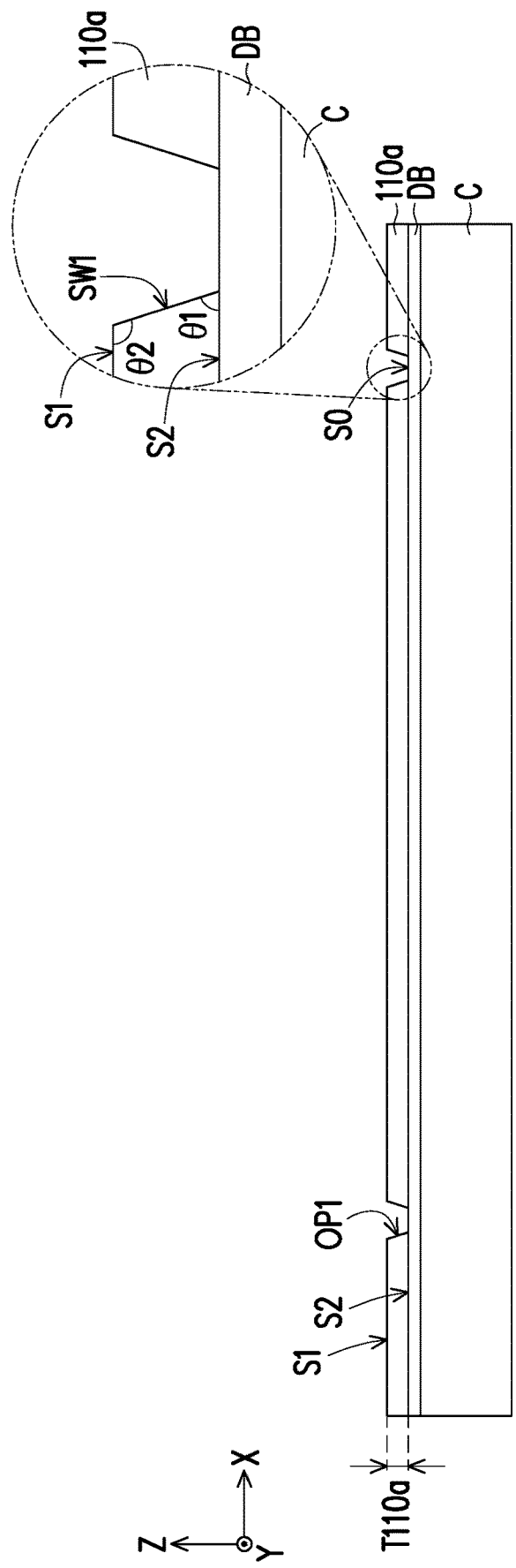
FIG. 1 to FIG. 8 are schematic cross sectional views of various stages in a manufacturing method of a package structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 8 are schematic cross sectional views of various stages in a manufacturing method of a package structure in accordance with some embodiments of the disclosure. In embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the present disclosure. In some embodiments, as shown in FIG. 1 to FIG. 8, one (semiconductor) chip or die is shown to represent plural (semiconductor) chips or dies of the wafer, and one (semiconductor) package structure is shown to represent plural (semiconductor) package structures obtained following the (semiconductor) manufacturing method, however the disclosure is not limited thereto. In alternative embodiments, more than one (semiconductor) chips or dies are shown to represent plural (semiconductor) chips or dies of the wafer, and one or more than one (semiconductor) package structure are shown to represent plural (semiconductor) package structures obtained following the (semiconductor) manufacturing method.

Referring to FIG. 1, in some embodiments, a carrier C with a debond layer DB and a solder resist layer 110*a* coated thereon is provided. In some embodiments, the carrier C may be a glass carrier or any suitable carrier for carrying a semiconductor wafer or a reconstituted wafer for the manufacturing method of the semiconductor package.

In some embodiments, the debond layer DB is disposed on the carrier C, as shown in FIG. 1. The material of the debond layer DB may be any material suitable for bonding and debonding the carrier C from the above layer(s) (e.g. the solder resist layer 110*a*) or any wafer(s) disposed thereon. In some embodiments, the debond layer DB may include a dielectric layer made of a dielectric material including any suitable polymer-based dielectric material (such as benzocyclobutene (BCB), polybenzoxazole (PBO)). In an alternative embodiment, the debond layer DB may include a dielectric material layer made of an epoxy-based thermal-release material, which loses its adhesive property when heated, such as a light-to-heat-conversion (LTHC) release coating film. In a further alternative embodiment, the debond layer DB may include a dielectric material layer made of an ultra-violet (UV) glue, which loses its adhesive property when exposed to UV lights. In certain embodiments, the debond layer DB may be dispensed as a liquid and cured, or may be a laminate film laminated onto the carrier C, or may be the like. The top surface of the debond layer DB, which is opposite to a bottom surface contacting the carrier C, may be levelled and may have a high degree of coplanarity. In certain embodiments, the debond layer DB is, for example, a LTHC layer with good chemical resistance, and such layer enables room temperature debonding from the carrier C by applying laser irradiation, however the disclosure is not limited thereto.

In some embodiments, the solder resist layer 110a is disposed on the debond layer DB, and the debond layer DB is located between the carrier C and the solder resist layer 110a. In some embodiments, a surface S1 (e.g. a top surface) of the solder resist layer 110a may provide a high degree of coplanarity and flatness. Due to the high degree of coplanarity and flatness, the formation of the later-formed layer(s) and/or element(s) is beneficial. As shown in FIG. 1, along a direction Z (e.g. a stacking direction of the carrier C, the debond layer DB and the solder resist layer 110a), a thickness T110a of the solder resist layer 110a is approximately from 10 μm to 30 μm.

In some embodiments, the solder resist layer 110a is a layer made of a solder resist material, where the solder resist material is composed of an epoxy-based resin and a filler. In the solder resist layer 110a, a weight percentage ratio of the epoxy-based resin to the filler is approximately from 40:60 to 60:40, in some embodiments. The filler, for example, includes silica ($SiO_2$), barium sulfate ($BaSO_4$), or a combination thereof, where a particle diameter of the filler is approximately from 0.2 μm to 2 μm. In some embodiments, the solder resist layer 110a is formed on the debond layer DB by lamination. In some embodiments, the solder resist layer 110a has a coefficient of thermal expansion (CTE) approximately ranging from 18 ppm/K to 35 ppm/K, a Young's modulus (E) approximately ranging from 5 GPa to 10 GPa, and a glass transition temperature (Tg) approximately ranging from 150 degrees Celsius to 180 degrees Celsius. In certain embodiments, the solder resist layer 110a is photosensitive (see package structures 10a and 10b respectively depicted in FIG. 6 and FIG. 10). However, the disclosure is not limited thereto; in alternative embodiments, the solder resist layer 110a is non-photosensitive (see package structures 10c and 10d respectively depicted in FIG. 14 and FIG. 16). Due to the solder resist layer 110a (e.g. low CTE value) in addition to its specific thickness range, better warpage control (e.g., warpage being less than or substantially equal to 80 μm at room temperature and being greater than or substantially equal to −80 μm) to the package structure 10a is achieved.

As illustrated in FIG. 1, in the embodiment of which the solder resist layer 110a is photosensitive, after the solder resist layer 110a is laminated onto the debond layer DB with a surface S2 (e.g. a bottom surface), a plurality of openings OP1 are formed, by photolithography processes, in the solder resist layer 110a to expose portions of the debond layer DB. For example, a surface S0 of the debond layer DB is partially exposed by the openings OP1 formed in the solder resist layer 110a. In the solder resist layer 110a shown in FIG. 1, an angle θ1 between the surface S2 of the solder resist layer 110a and a sidewall SW1 of each opening OP1 is approximately 60 degrees to 80 degrees, and an angle θ2 (i.e. θ2=180 degrees-θ1) between the surface S1 of the solder resist layer 110a and the sidewall SW1 of each opening OP1 is 100 degrees to 120 degrees. The surface S2 is opposite to the surface S1 along the direction Z, and the surface S2 is stacked on the surface S0 of the debond layer DB as shown in FIG. 1, for example. With the formation of the solder resist layer 110a having the openings OP1, the manufacturing cost and process complexity are further reduced.

Only two openings OP1 are shown in FIG. 1 for illustrative purposes, and the disclosure is not limited thereto. The number of the openings OP1 may be more than two based on the demand and the design layout. Additionally, for example, on a X-Y plane (where a direction X is different from a direction Y, and the directions X and Y are different from the direction Z (e.g. the stacking direction)), dimensions (e.g. maximum widths) of the openings OP1 may be the same, however the disclosure is not limited thereto. In an alternative embodiment, according to the design layout and/or demand, the dimensions of the openings OP1 may be the different from each other or may be different in a manner of different groups. In one embodiment, on the X-Y plane, a cross-sectional shape of the openings OP1 individually may be round, elliptical, oval, tetragonal, octagonal or any suitable polygonal shape; the disclosure is not limited thereto.

Figure 2:
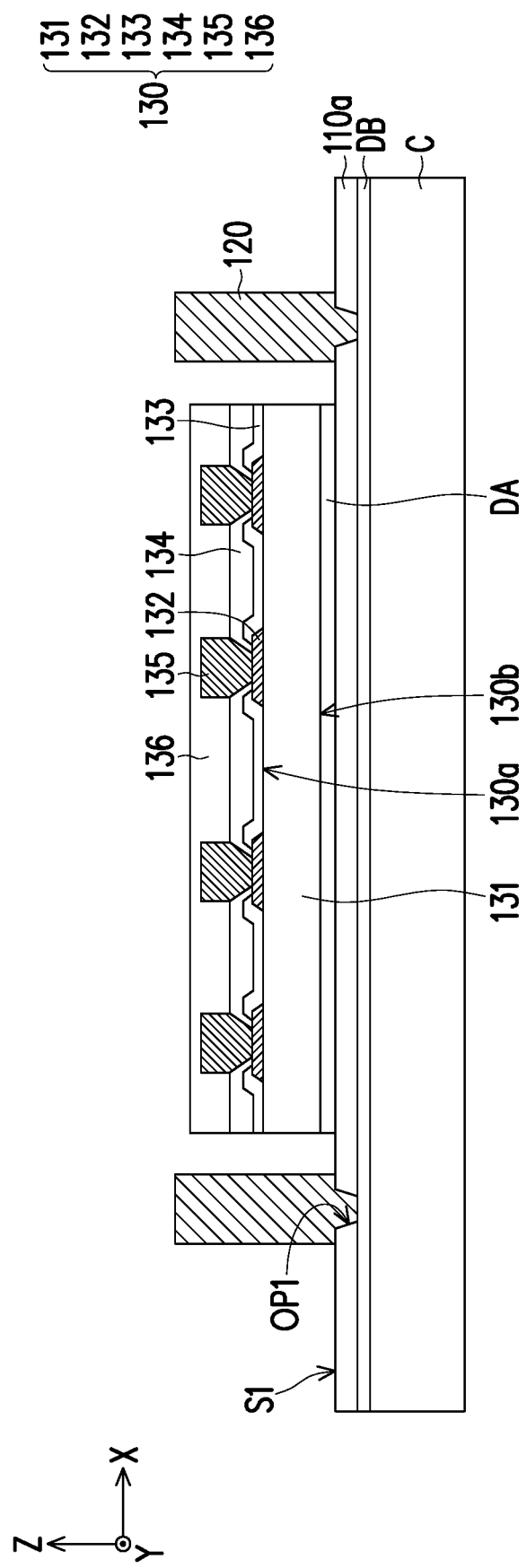

Referring to FIG. 2, in some embodiments, at least one conductive pillar 120 and at least one semiconductor die 130 are formed on the solder resist layer 110a. For illustrative purposes, the at least one conductive pillar 120 include a plurality of conductive pillars 120 (e.g. two conductive pillars 120), and at least one semiconductor die 130 include one semiconductor die 130, as presented in FIG. 2. However, the number of the conductive pillars 120 and the number of the semiconductor die 130 are not limited to what is depicted in the disclosure, and may be selected and designated based on the demand and design layout. For example, the number of the conductive pillars 120 may be more than two and the number of the semiconductor die 130 may be more than one, where the number of the conductive pillars 120 may be adjusted by changing the number of the openings OP1. In some embodiments, the conductive pillars 120 and the semiconductor die 130 are arranged side-by-side on the solder resist layer 110a.

In some embodiments, the conductive pillars 120 are formed on the solder resist layer 110a (e.g. the surface S1 of the solder resist layer 110a). In some embodiments, the conductive pillars 120 may be through integrated fan-out (InFO) vias. In some embodiments, the conductive pillars 120 are arranged along but not on a cutting line (not shown) between two package structures (e.g. two of the package structures 10a). As shown in FIG. 2, the conductive pillars 120 are formed on the solder resist layer 110a and penetrate through the solder resist layer 110a via the openings OP1, in some embodiment. Through the openings OP1, the conductive pillars 120 are in physical contact with the debond layer DB, for example.

In some embodiments, the conductive pillars 120 are formed by photolithography, plating, photoresist stripping processes or any other suitable method. For example, the plating process may include an electroplating plating, an electroless plating, or the like. For example, the conductive pillars 120 may be formed by forming a mask pattern (not shown) covering the solder resist layer 110a with openings exposing the surface S0 of the debond layer DB exposed by the openings OP1 formed in the solder resist layer 110a, forming a metallic material filling the openings formed in the mask pattern and the openings OP1 to form the conductive pillars 120 by electroplating or deposition and then removing the mask pattern. In one embodiment, the mask pattern may be removed by acceptable ashing process and/or photoresist stripping process, such as using an oxygen plasma or the like. In some embodiments, prior to the formation of the mask pattern, a seed layer (not shown) may be formed conformally over the solder resist layer 110a and extend into the openings OP1 to be located on the debond layer DB, where the metallic material filling the openings formed in the mask pattern and the openings OP1 formed in the solder resist layer 110a is used as an mask to remove portions of the seed layer not being covered thereto. The disclosure is not limited thereto. In some embodiments, the material of the conductive pillars 120 may include a metal material such as copper or copper alloys, or the like. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

However, the disclosure is not limited thereto. In alternative embodiments, the conductive pillars 120 may be pre-fabricated conductive pillars which may be disposed on the solder resist layer 110a by picking- and placing.

Continued on FIG. 2, in some embodiments, the semiconductor die 130 is disposed on the solder resist layer 110a and over the carrier C. For example, the semiconductor die 130 is picked-up and placed on the solder resist layer 110a, and is attached or adhered on the solder resist layer 110a through a connecting film DA. In some embodiments, the connecting film DA is located between the semiconductor die 130 and the solder resist layer 110a, where the connecting film DA physically contacts the backside surface 130b of the semiconductor die 130 and the solder resist layer 110a (e.g. the surface S1 of the solder resist layer 110a). Due to the connecting film DA, the semiconductor die 130 and the solder resist layer 110a are stably adhered to each other. In some embodiments, the connecting film DA may be, for example, a die attach film, a layer made of adhesives or epoxy resin, or the like.

In some embodiments, the semiconductor die 130 includes a substrate 131 having an active surface 130a and a backside surface 130b opposite to the active surface 130a (along the direction Z), a plurality of conductive pads 132 formed on the active surface 130a, a passivation layer 133 disposed on and partially exposing the conductive pads 132, a post-passivation layer 134 disposed on the passivation layer 133 and partially exposing the conductive pads 132, connecting vias 135 disposed on the conductive pads 132, and a protection layer 136 covering the post-passivation layer 134 and the connecting vias 135. In other words, the conductive pads 132 distributed on the active surface 130a of the substrate 131 are partially exposed by contact openings of the passivation layer 133 and contact openings of the post-passivation layer 134, so as to physically connect to the connecting vias 135.

For example, the substrate 131 is a semiconductor substrate. In some embodiments, the material of the substrate 131 may include a silicon substrate including active components (e.g., transistors and/or memories such as NMOS and/or PMOS devices, or the like) and/or passive components (e.g., resistors, capacitors, inductors or the like) formed therein. In an alternative embodiment, the substrate 131 may be a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. The disclosure is not limited thereto.

In some embodiments, the conductive pads 132 may be aluminum pads or other suitable metal pads. For example, the conductive pads 132 may be formed by electroplating or deposition, and then patterned using a photolithography and etching process.

In some embodiments, the connecting vias 135 may be copper pillars, copper alloy pillar or other suitable metal pillars. For example, the forming process of the connecting vias 135 may be substantially the same or similar to the formation of the conductive pillars 120. However, the disclosure is not limited thereto.

In some embodiments, the passivation layer 133, the post-passivation layer 134 and/or the protection layer 136 may be a PBO layer, a polyimide (PI) layer or other suitable polymers. In certain embodiments, the passivation layer 133, the post-passivation layer 134 and/or the protection layer 136 may be made of inorganic materials, such as silicon oxide, silicon nitride, silicon oxynitride, or any suitable dielectric material. In one embodiment, the materials of the passivation layer 133, the post-passivation layer 134 and/or the protection layer 136 may be the same. In an alternative embodiment, the materials of the passivation layer 133, the post-passivation layer 134 and/or the protection layer 136 may be different from one another, the disclosure is not limited thereto.

In some embodiments, the semiconductor die 130 described herein may be referred to as a chip or an integrated circuit (IC). For example, in an alternative embodiment, the semiconductor die 130 includes a digital chip, an analog chip, or a mixed signal chip, such as an application-specific integrated circuit ("ASIC") chip, a sensor chip, a wireless and radio frequency (RF) chip, a memory chip, a logic chip, a voltage regulator chip, or a combination thereof. In an alternative embodiment, the semiconductor die 130 may be referred to as a chip or an IC of combination-type. For example, the semiconductor die 130 may be a WiFi chip simultaneously including both of a RF chip and a digital chip. The disclosure is not limited thereto.

In alternative embodiments, the semiconductor die 130 may further include additional semiconductor die(s) of the same type or different types. For example, the additional semiconductor die(s) may include digital chips, analog chips or mixed signal chips, such as ASIC chips, sensor chips, wireless and RF chips, memory chips, logic chips or voltage regulator chips. The disclosure is not limited thereto.

As shown in FIG. 2, for example, positioning locations of the conductive pillars 120 are located aside of a positioning location of the semiconductor die 130 on the X-Y plane. In some embodiments, along the direction Z, a height of the conductive pillars 120 is greater than a height of the semiconductor die 130; however, the disclosure is not limited thereto. In an alternative embodiment, the height of the conductive pillars 120 may be less than or substantially equal to the height of the semiconductor die 130. In one embodiment, the conductive pillars 120 may be formed prior to the formation of the semiconductor die 130; however, the disclosure is not limited thereto. In an alternative embodiment, the conductive pillars 120 may be formed after the formation of the semiconductor die 130.

Figure 3:
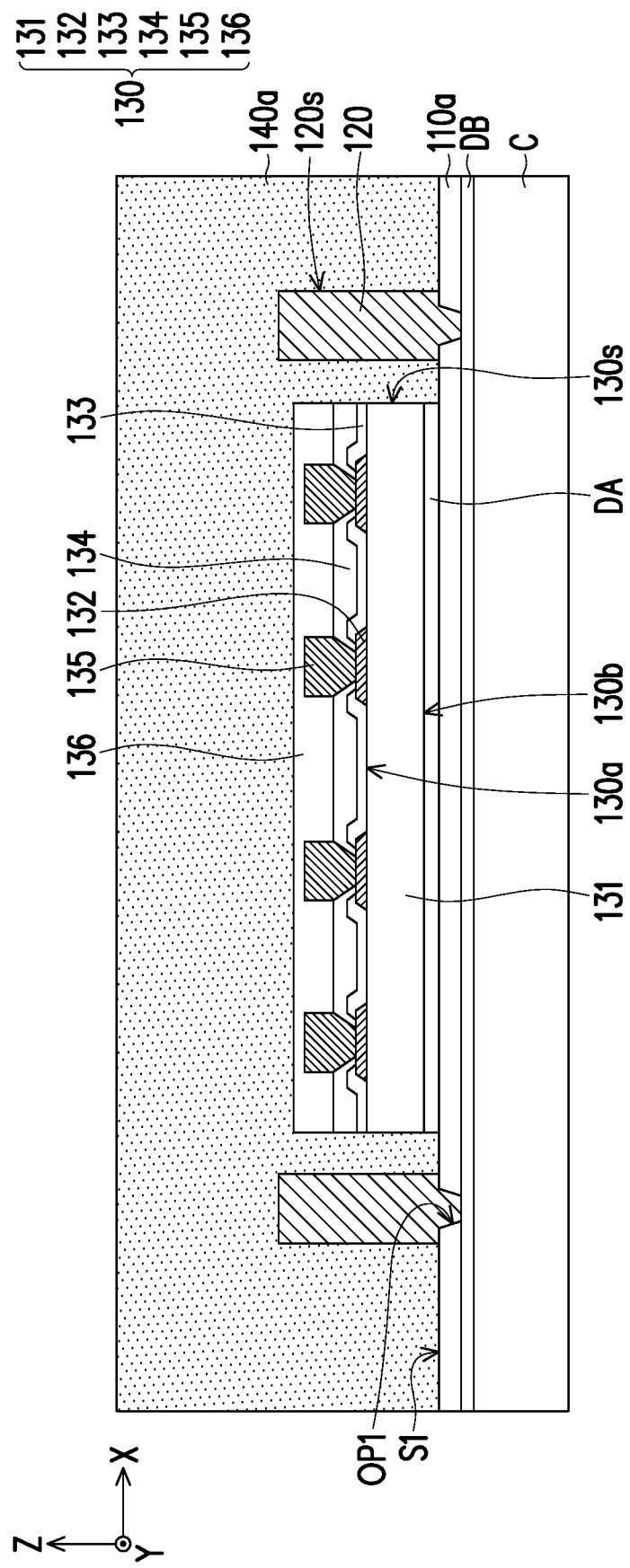

Referring to FIG. 3, in some embodiments, an insulating encapsulation 140a is formed over the carrier C (e.g., on the solder resist layer 110a) to encapsulate the conductive pillars 120 and the semiconductor die 130. In other words, the insulating encapsulation 140a is formed on the solder resist layer 110a, the conductive pillars 120 and the semiconductor die 130, where the conductive pillars 120 and the semiconductor die 130 (disposed with the connecting film DA) are covered by and embedded in the insulating encapsulation 140a. As shown in FIG. 3, for example, the insulating encapsulation 140a at least fills up the gaps between the conductive pillars 120 and the gaps between the conductive pillars 120, the semiconductor die 130 and the connecting films DA. In some embodiments, sidewalls 120s of the conductive pillars 120 and sidewalls 130s of the semiconductor die 130 are covered by the insulating encapsulation 140a. In some embodiments, the surface S1 of the solder resist layer 110a exposed by the conductive pillars 120 and the semiconductor die 130 are covered by the insulating encapsulation 140a. For example, as shown in FIG. 3, the solder resist layer 110a, the conductive pillars 120, the semiconductor die 130 and the connecting film DA are not accessibly revealed by the insulating encapsulation 140a.

In some embodiments, the insulating encapsulation 140a is a molding compound formed by a molding process. In some embodiments, the insulating encapsulation 140a, for example, may include polymers (such as epoxy resins, phenolic resins, silicon-containing resins, or other suitable resins), dielectric materials having low permittivity and low loss tangent properties, or other suitable materials. The disclosure is not limited thereto. In an alternative embodiment, the insulating encapsulation 140a may include an acceptable insulating encapsulation material. In some embodiments, the insulating encapsulation 140a may further include inorganic filler or inorganic compound (e.g. silica, clay, and so on) which can be added therein to optimize the CTE of the insulating encapsulation 140a. In the disclosure, the material of the insulating encapsulation 140a is different from the material of the solder resist layer 110a, where the CTE of the insulating encapsulation 140a is less than the CTE of the solder resist layer 110a.

Figure 4:
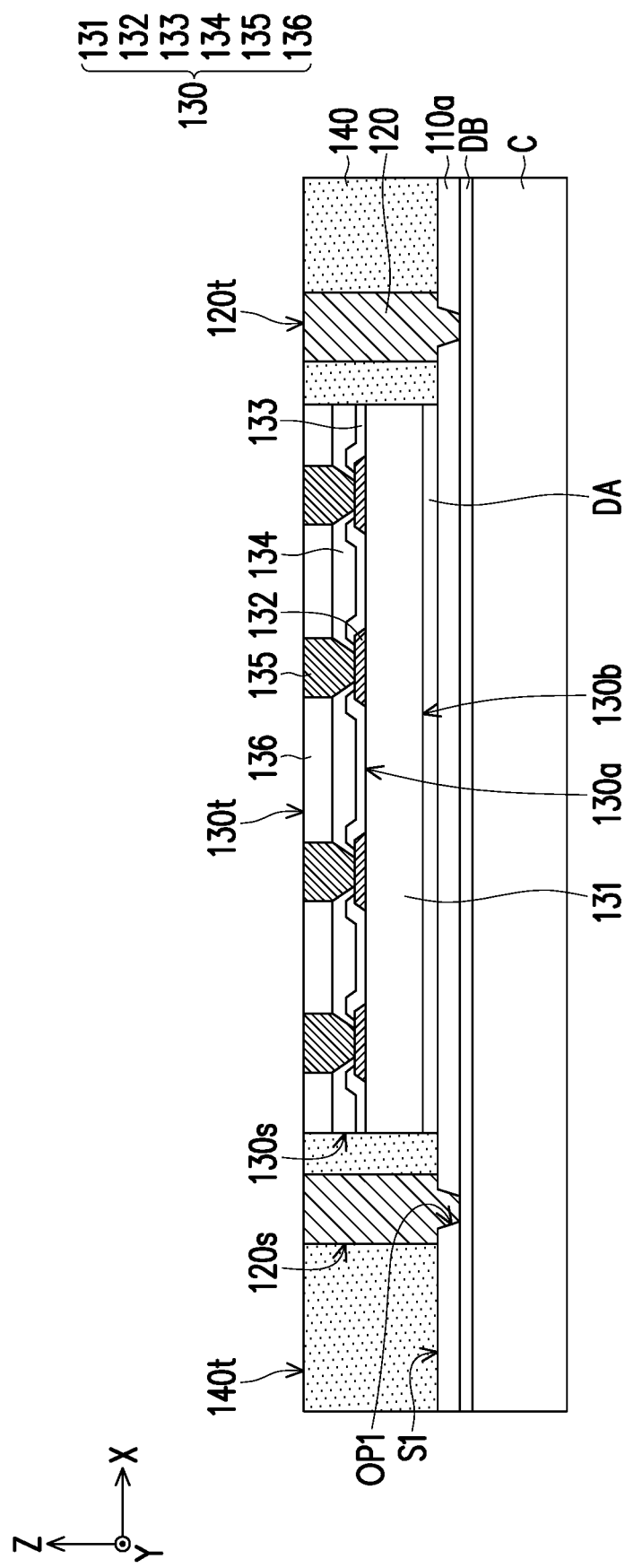

Referring to FIG. 4, in some embodiments, the insulating encapsulation 140a is planarized to form an insulating encapsulation 140 exposing the conductive pillars 120 and the semiconductor die 130. In certain embodiments, as shown in FIG. 4, after the planarization, top surfaces 120t of the conductive pillars 120 and a top (or front) surface 130t of the semiconductor die 130 (e.g. top surfaces (not labelled) of the connecting vias 135 and the protection layer 136 of the semiconductor die 130) are exposed by a top surface 140t of the insulating encapsulation 140. That is, for example, the top surface 130t of the semiconductor die 130 and the top surfaces 120t of the conductive pillars 120 become substantially leveled with the top surface 140t of the insulating encapsulation 140. In other words, the top surface 130t of the semiconductor die 130, the top surfaces 120t of the conductive pillars 120, and the top surface 140t of the insulating encapsulation 140 are substantially coplanar to each other. In some embodiments, the conductive pillars 120 each penetrate through the insulating encapsulation 140 and have the top surfaces 120t exposed therefrom, while the semiconductor die 130 are embedded inside the insulating encapsulation 140 and has the top surface 130t exposed therefrom. For example, as shown in FIG. 4, the conductive pillars 120 and the semiconductor die 130 are accessibly revealed by the insulating encapsulation 140.

The insulating encapsulation 140a may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 140a, the connecting vias 135 and the protection layer 136 of the semiconductor die 130 and the conductive pillars 120 may also be planarized. In certain embodiments, the planarizing step may, for example, be performed on the over-molded insulating encapsulation 140a to level the top surface 140t of the insulating encapsulation 140, the top surfaces 120t of the conductive pillars 120 and the top surface 130t of the semiconductor die 130.

Figure 5:
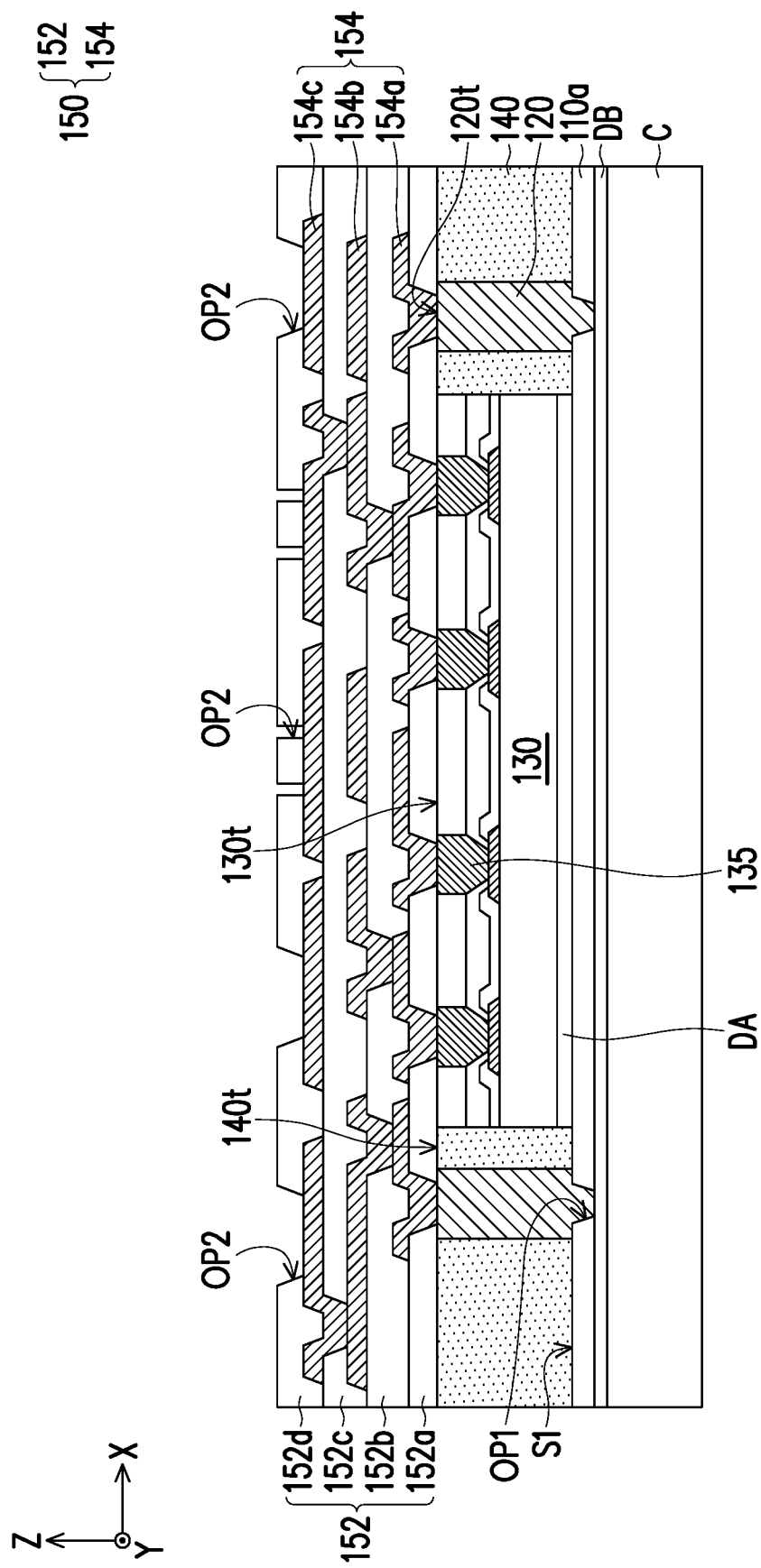

Referring to FIG. 5, in some embodiments, a redistribution circuit structure 150 is formed on the conductive pillars 120, the semiconductor die 130, and the insulating encapsulation 140. As shown in FIG. 5, the redistribution circuit structure 150 is directly formed on the top surfaces 120t of the conductive pillars 120, the top surface 130t of the semiconductor die 130, and the top surface 140t of the insulating encapsulation 140, for example. In some embodiments, the redistribution circuit structure 150 is electrically connected to the conductive pillars 120, and is electrically connected to the semiconductor die 130 through the connecting vias 135. In some embodiments, through the redistribution circuit structure 150, the semiconductor die 130 is electrically connected to the conductive pillars 120. In alternative embodiments of which more than one semiconductor dies 130 are included, the semiconductor dies 130 are electrically communicated through the redistribution circuit structure 150. As shown in FIG. 5, for example, the redistribution circuit structure 150 is referred to as a front-side redistribution layer of the semiconductor die 130.

For example, as shown in FIG. 5, along the stacking direction (e.g. the direction Z), the semiconductor die 130 is located between the redistribution circuit structure 150 and the connecting film DA. In addition, a portion of each of the conductive pillars 120 is located between the redistribution circuit structure 150 and the solder resist layer 110a, and other portion of each of the conductive pillars 120 is located between the redistribution circuit structure 150 and the debond layer DB. The insulating encapsulation 140 is located between the redistribution circuit structure 150 and the solder resist layer 110a, for example.

In some embodiments, the formation of the redistribution circuit structure 150 includes sequentially forming one or more dielectric layers 152 and one or more metallization layers 154 in alternation. For example, as shown in FIG. 5, the redistribution circuit structure 150 includes dielectric layers 152a, 152b, 152c, 152d and the metallization layers 154a, 154b, 154c. In some embodiments, the metallization layer 154a is sandwiched between the dielectric layers 152a and 152b, the metallization layer 154b is sandwiched between the dielectric layers 152b and 152c, the metallization layer 154c is sandwiched between the dielectric layers 152c and 152d. The disclosure is not limited thereto. It should be noted that the redistribution circuit structure 150 is not limited to include four dielectric layers and three metallization layers. For example, the number of the metallization layers and the numbers of the dielectric layers may be one or more than one.

In some embodiments, the material of the dielectric layers 152 may be PI, PBO, BCB, a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 152 formed by suitable fabrication techniques such as spin-on coating, chemical vapor deposition (CVD), plasma-enhanced chemical vapor deposition (PECVD) or the like. The disclosure is not limited thereto. In some embodiments, the material of the metallization layers 154 may be made of conductive materials formed by electroplating or deposition, such as aluminum, titanium, copper, nickel, tungsten, and/or alloys thereof, which may be patterned using a photolithography and etching process. In some embodiments, the metallization layers 154 may be patterned copper layers or other suitable patterned metal layers.

In some embodiments, a seed layer (not shown) may be formed between one metallization layer 154 and a respective one dielectric layer 152 underlying thereto. In some embodiments, the seed layer may be referred to as a metal layer, which may be a single layer or a composite layer comprising a plurality of sub-layers formed of different materials. In some embodiments, a material of the seed layer may include titanium, copper, molybdenum, tungsten, titanium nitride, titanium tungsten, combinations thereof, or the like. For example, the seed layer may include a titanium layer and a copper layer over the titanium layer. In some embodiments, the seed layer may be formed using, for example, sputtering, physical vapor deposition (PVD), or the like.

In some embodiments, portions of a top surface of a topmost layer (e.g. the metallization layer 154c) of the metallization layers 154 are exposed by a topmost layer (e.g. the dielectric layer 152d) of the dielectric layers 152 to electrically connect overlying conductive features (e.g. later-formed under bump metallurgy (UBM) patterns 162 and/or contact pads 164). For example, as shown in FIG. 5, the portions of the top surface of the metallization layer 154c are exposed by openings OP2 formed in the the dielectric layer 152d. In some embodiments, portions of a bottom surface of a lowest layer (e.g. the metallization layer 154a) of the metallization layers 154 are exposed by a lowest layer (e.g. the dielectric layer 152a) of the dielectric layers 152 to electrically connect underlying conductive features (e.g. the conductive pillars 120 and the connecting vias 135 of the semiconductor die 130). As shown in FIG. 5, in some embodiments, the conductive pillars 120, and the redistribution circuit structure 150 provide a routing function for the semiconductor die 130.

Figure 6:
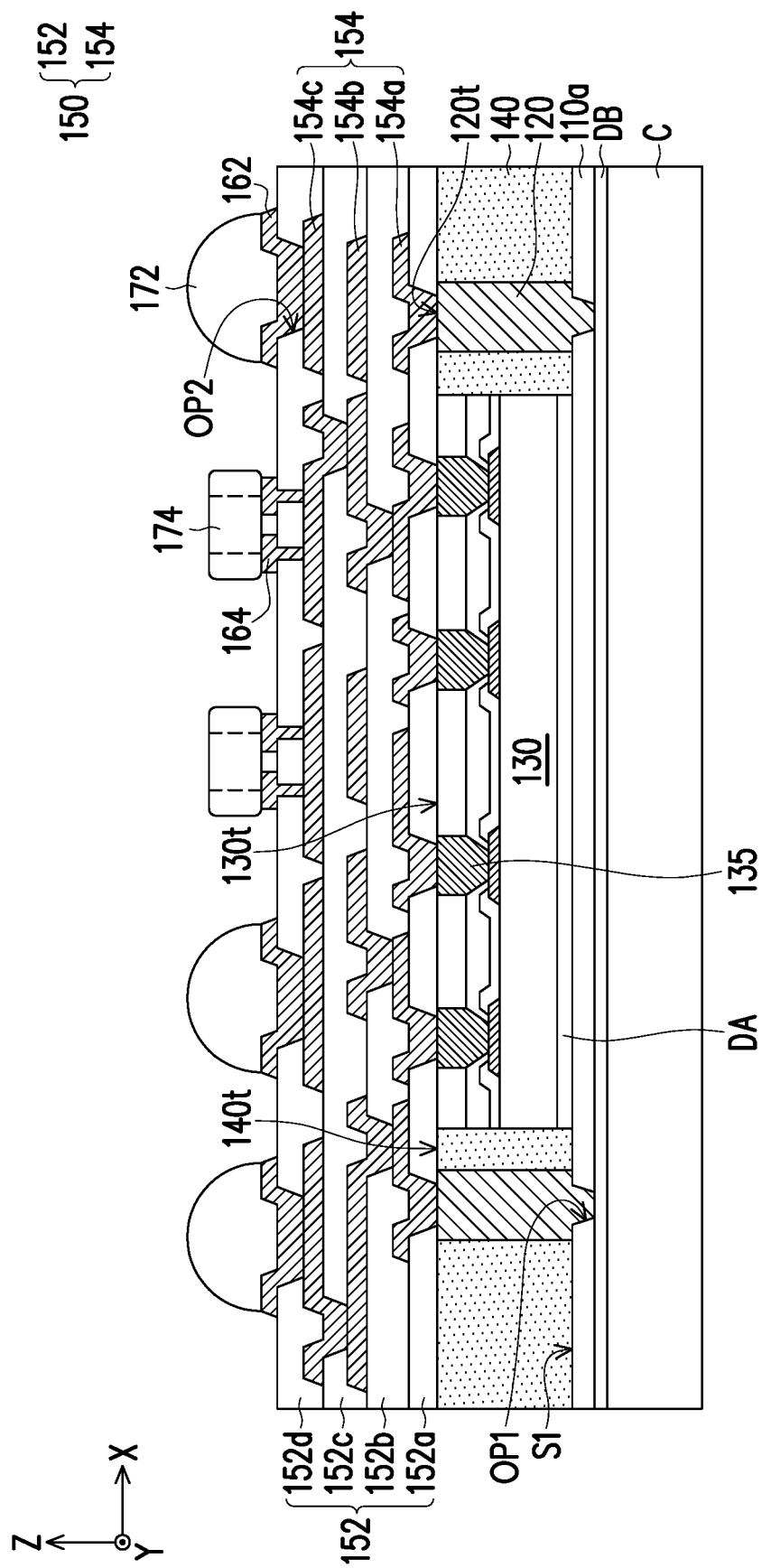

Referring to FIG. 6, in some embodiments, a plurality of UBM patterns 162 are formed to be disposed on the exposed top surfaces of the topmost layer (e.g. the metallization layer 154c) of the metallization layers 154 for electrically connecting with conductive elements (e.g. conductive balls or conductive bumps). In some embodiments, prior to, during, or after the formation of the UBM patterns 162, a plurality of contact pads 164 are optionally formed to be disposed on some of the exposed top surfaces of the topmost layer (e.g. the metallization layer 154c) of the metallization layers 154 for electrically connecting with semiconductor elements (e.g. semiconductor active or passive devices). The number of the UBM patterns 162 and the number of the contact pads 164 are not limited as depicted in the disclosure, and may be selected and designated based on the demand and design layout, the disclosure is not limited thereto.

For example, as shown in FIG. 6, the UBM patterns 162 and the contact pads 164 are formed on and electrically connected to the redistribution circuit structure 150. For example, the UBM patterns 162 and the contact pads 164 are disposed on the dielectric layer 152d and further in contact with the portions of the metallization layer 154c exposed by the openings OP2 formed in the dielectric layer 152d. In some embodiments, the materials of the UBM patterns 162 and the contact pads 164 may include copper, nickel, titanium, tungsten, or alloys thereof or the like, and may be formed by an electroplating process, for example. In one embodiment, the material of the UBM patterns 162 may be the same as that of the contact pads 164. In an alternative embodiment, the material of the UBM patterns 162 may be different from that of the contact pads 164. In one embodiment, there may be only the UBM patterns 162; however, the disclosure is not limited thereto. In one embodiment, the UBM patterns 162 and the contact pads 164 may be formed in the same processing step. In an alternative embodiment, the UBM patterns 162 and the contact pads 164 may be formed in different processing steps.

Continued on FIG. 6, in some embodiments, a plurality of conductive elements 172 are formed on the redistribution circuit structure 150. For example, the conductive elements 172 are disposed on the UBM patterns 162 located on the redistribution circuit structure 150. In some embodiments, the conductive elements 172 may be disposed on the UBM patterns 162 by ball placement process or reflow process. In some embodiments, the conductive elements 172 are, for example, controlled collapse chip connection (C4) bumps, ball grid array (BGA) balls, solder balls/bumps or other connectors. When solder is used, the solder may include either eutectic solder or non-eutectic solder. The solder may include lead or be lead-free, and may include Sn—Ag, Sn—Cu, Sn—Ag—Cu, or the like. In the disclosure, for one embodiment, the conductive elements 172 may be referred to as conductive connectors for connecting with another package; or for another embodiment, the conductive elements 172 may be referred to as conductive terminals for inputting/outputting electric and/or power signals. In some embodiments, the conductive elements 172 are electrically connected (e.g. electrically coupled) to the redistribution circuit structure 150 through the UBM patterns 162. As shown in the FIG. 6, some of the conductive elements 172 are electrically connected to the semiconductor die 130 through the UBM patterns 162 and the redistribution circuit structure 150, and some of the conductive elements 172 are electrically connected to the conductive pillars 120 through the UBM patterns 162 and the redistribution circuit structure 150, for example. The number of the conductive elements 172 is not limited to the disclosure, and may be designated and selected based on the number of the UBM patterns 162.

In some embodiments, one or more semiconductor devices 174 are provided and disposed on the redistribution circuit structure 150. For example, the semiconductor devices 174 are disposed on the contact pads 164, and are electrically connected to the redistribution circuit structure 150 through the contact pads 164. In some embodiments, some of the semiconductor devices 174 are electrically connected to the semiconductor die 130 through the contact pads 164 and the redistribution circuit structure 150. In some embodiments, some of the semiconductor devices 174 are electrically connected to the conductive pillars 120 through the contact pads 164 and the redistribution circuit structure 150. In some embodiments, some of the semiconductor devices 174 are electrically connected to at least one of the conductive elements 172 through the contact pads 164, the redistribution circuit structure 150 and the UBM patterns 162. In some embodiments, the semiconductor devices 174 may be disposed on the contact pads 164 through reflow process or flip chip bonding. In some embodiments, the semiconductor devices 174 include surface mount devices (e.g. passive devices, such as, capacitors, resistors, inductors, combinations thereof, or the like). The number of the semiconductor devices 174 can be selected based on the number of the contact pads 164. In an alternative embodiment, the semiconductor devices 174 may include surface mount devices of the same type or different types, the disclosure is not limited thereto. In alternative embodiments, the semiconductor devices 174 are optional, and may be omitted.

In some embodiments, along the direction Z, the conductive elements 172 and the semiconductor devices 174 are formed on a side of the redistribution circuit structure 150, and the insulating encapsulation 140 is formed on other side of the redistribution circuit structure 150. That is, the redistribution circuit structure 150 is located between the insulating encapsulation 140 and the conductive elements 172 and between the insulating encapsulation 140 and the semiconductor devices 174. In some embodiments, the semiconductor devices 174 may be formed prior to the formation of the conductive elements 172. In an alternative embodiment, the conductive elements 172 may be formed prior to the formation of the semiconductor devices 174. The disclosure is not limited to thereto.

Figure 7:
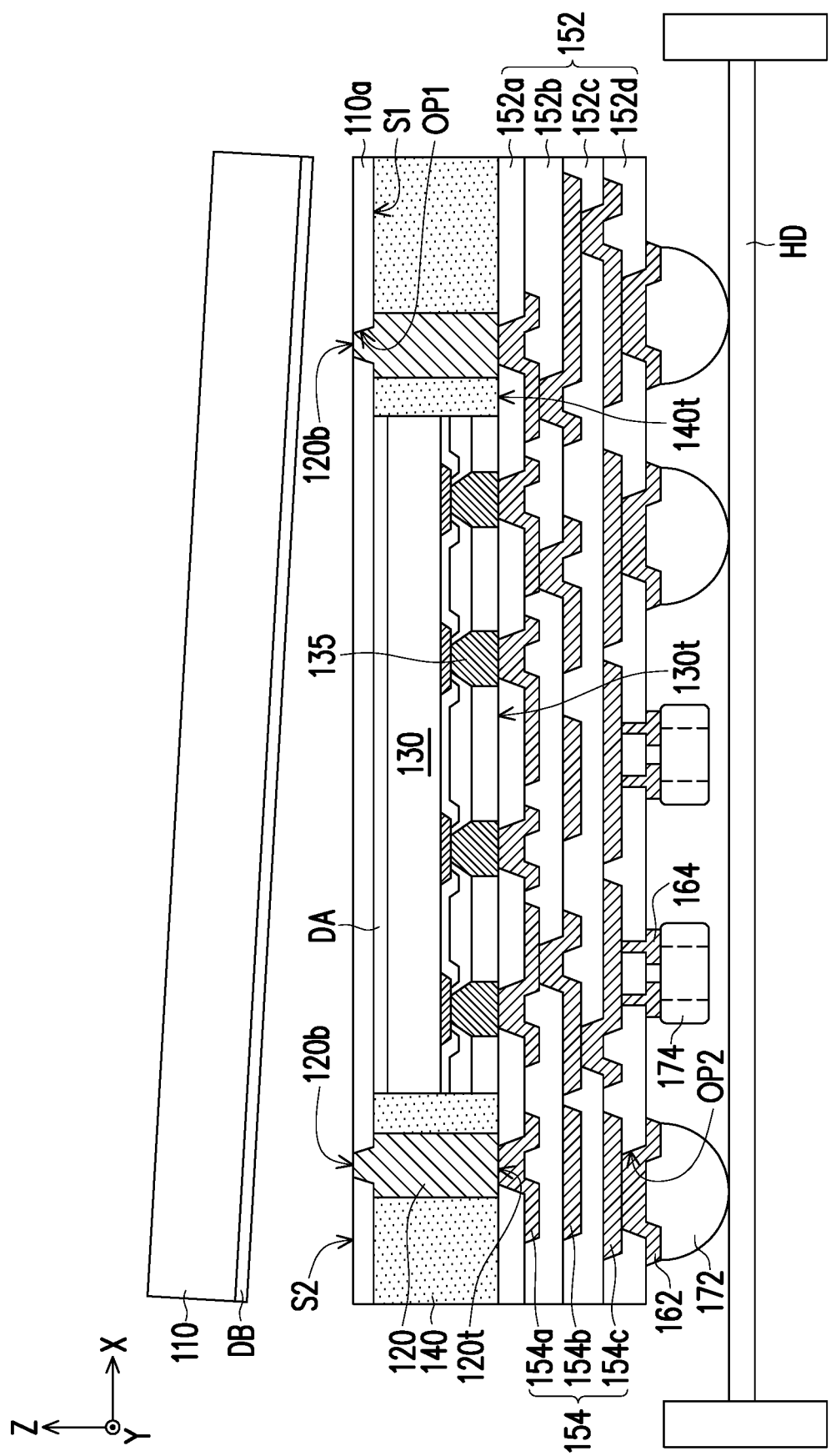

Referring to FIG. 7, in some embodiments, the whole structure depicted in FIG. 6 along with the carrier C is flipped (turned upside down), where the conductive elements 172 are placed to a holding device HD, and the carrier C is then debonded from the solder resist layer 110a. In some embodiments, the holding device HD may be an adhesive tape, a carrier film or a suction pad. The solder resist layer 110a is easily separated from the carrier C due to the debond layer DB. In some embodiments, the carrier C is detached from the solder resist layer 110a through a debonding process, and the carrier C and the debond layer DB are removed. For example, the surface S2 of the solder resist layer 110a and bottom surface 120b of the conductive pillars 120 are exposed. In one embodiment, the debonding process is a laser debonding process. During the debonding step, the holding device HD is used to secure the package depicted in FIG. 6 before debonding the carrier C and the debond layer DB. As shown in FIG. 7, for example, the openings OP1 are filled up with the conductive pillars 120, where the surfaces 120b of the conductive pillars 120 are substantially coplanar with the surface S2 of the solder resist layer 110a.

Figure 8:
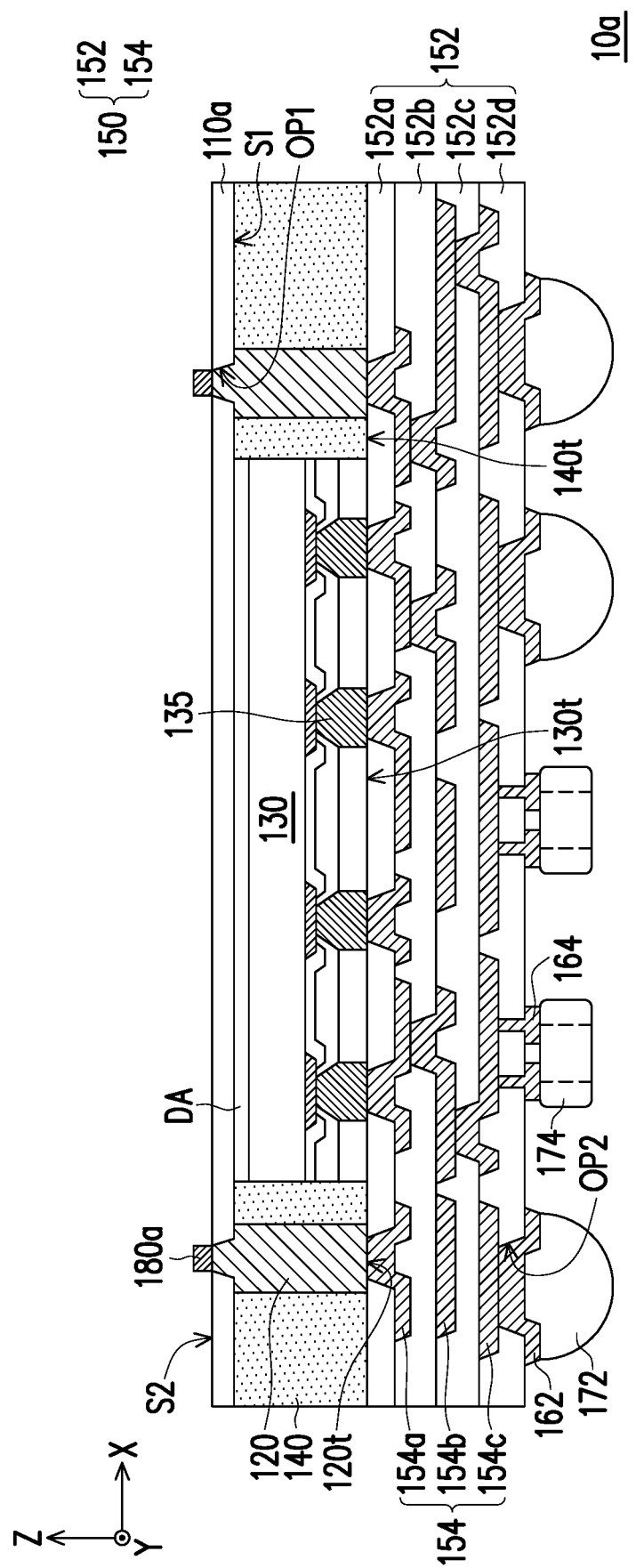

Referring to FIG. 8, in some embodiments, a plurality of conductive elements 180a are formed on the bottom surfaces 120b of the conductive pillars 120. For example, the bottom surfaces 120b of the conductive pillars 120 exposed by the surface S2 of the solder resist layer 110a are covered by the conductive elements 180a. For example, the conductive elements 180a include conductive bumps or conductive balls. The conductive elements 180a may be pre-solder pastes, for example. In an alternative embodiment, the conductive elements 180a may be pre-solder blocks. In some embodiments, the material of the conductive elements 180a may include a lead-free solder material (such as Sn—Ag base or Sn—Ag—Cu base materials) with or without additional impurity (such as Ni, Bi, Sb, Au, or the like). The disclosure is not limited thereto. In the disclosure, the conductive elements 180a may also be referred to as conductive terminals for electrical connection to external elements (e.g. an additional semiconductor package/device, a circuit substrate, etc.). As shown in FIG. 8, the conductive elements 180a are formed outside of the openings OP1 and covered the surfaces 120b of the conductive pillars 120. That is, the conductive elements 180a are rest at the surface S2 of the solder resist layer 110a and are protruding outwards from the surface S2.

In some embodiments, the conductive elements 172 are released from the holding device HD to form the package structure 10a. In some embodiments, a dicing (singulating) process is performed to cut a plurality of the package structures 10a interconnected therebetween into individual and separated package structures 10a before releasing the conductive elements 172 from the holding device HD. In one embodiment, the dicing process is a wafer dicing process including mechanical blade sawing or laser cutting. Up to here, the manufacture of the package structure 10a is completed. The package structure 10a depicted in FIG. 8 may be referred to as an integrated fan-out (semiconductor) package structure having dual-side terminals.

In some alternative embodiments, the package structure 10a may be further mounted with a circuit substrate, an interposer, an additional package, chips/dies or other electronic devices to form a stacked package structure or a package on package (PoP) structure through the conductive elements 172 and/or other the conductive elements 180a based on the design layout and the demand.

Figure 9:
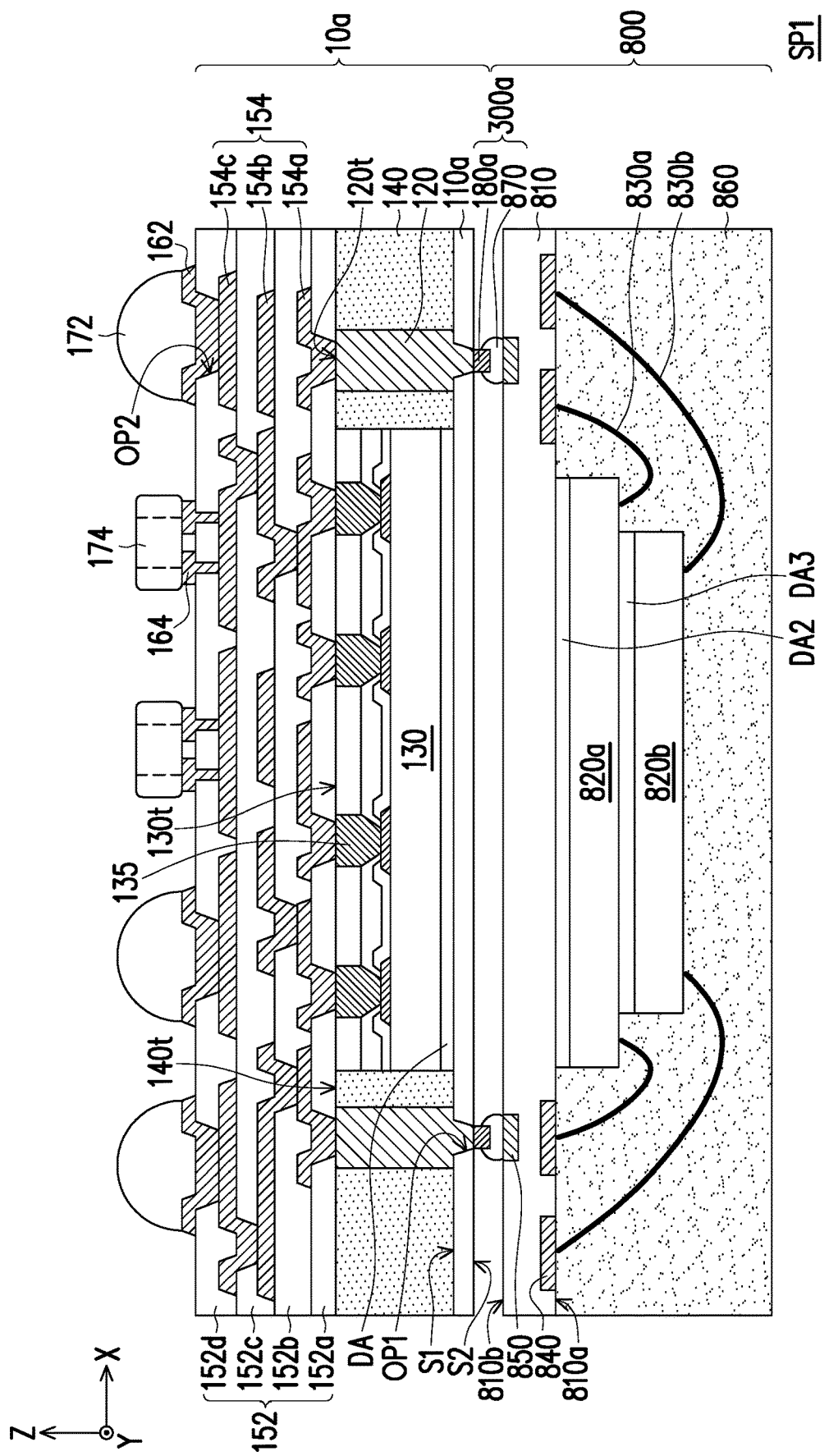
FIG. 9 is a schematic cross sectional view of a package structure in accordance with some embodiments of the disclosure.

FIG. 9 is a schematic cross sectional view of a package structure in accordance with some embodiments of the disclosure. The elements similar to or substantially the same as the elements described previously will use the same reference numbers, and certain details or descriptions (e.g. the materials, formation processes, positioning configurations, etc.) of the same elements would not be repeated herein. Referring to FIG. 9, for example, a semiconductor package 800 is provided and then bonded to the package structure 10a, thereby forming a package structure SP1 of a stacked structure. The detail of the package structure 10a is described in FIG. 8, and thus is not repeated herein for simplicity.

In some embodiments, the semiconductor package 800 has a substrate 810, semiconductor dies 820a and 820b, bonding wires 830a and 830b, conductive pads 840, conductive pads 850, an insulating encapsulation 860, and conductive elements 870. For example, the semiconductor die 820a and the semiconductor die 820b are provided and disposed on the substrate 810. In some embodiments, the connecting film DA2 is located between the semiconductor die 820a and the substrate 810, and the connecting film DA3 is located between the semiconductor die 820a and the semiconductor die 820b. In some embodiments, due to the connecting films DA2 and DA3 respectively provided between the semiconductor die 820a and the substrate 810 and between the semiconductor dies 820a and 820b, the semiconductor dies 820a, 820b are stably adhered to the substrate 810. In some embodiments, the connecting films DA2, DA3 may be, for example, a die attach film, a layer made of adhesives or epoxy resin, or the like.

For example, the semiconductor dies 820a and 820b are mounted on one surface (e.g. a surface 810a) of the substrate 810. In some embodiments, the semiconductor dies 820a and 820b may be logic chips (e.g., central processing units, microcontrollers, etc.), memory chips (e.g., dynamic random access memory (DRAM) chips, static random access memory (SRAM) chips, etc.), power management chips (e.g., power management integrated circuit (PMIC) chips), radio frequency (RF) chips, sensor chips, signal processing chips (e.g., digital signal processing (DSP) chips), and/or front-end chips (e.g., analog front-end (AFE) chips, the like, or a combination thereof). The semiconductor dies 820*a* and 820*b* are DRAM chips, as shown in FIG. 9, for example. In one embodiment, the semiconductor dies 820*a* and 820*b* may be the same. However, the disclosure is not limited thereto; in an alternative embodiment, the semiconductor dies 820*a* and 820*b* may be different from each other.

In some embodiments, the bonding wires 830*a* and 830*b* are respectively used to provide electrical connections between the semiconductor dies 820*a*, 820*b* and some of the conductive pads 840 (such as bonding pads) located on the surface 810*a* of the substrate 810. Owing to the bonding wires 830*a* and 830*b*, the semiconductor dies 820*a* and 820*b* are electrically connected to the substrate 810.

In some embodiments, the insulating encapsulation 860 is formed on the surface 810*a* of the substrate 810 to encapsulate the semiconductor dies 820*a*, 820*b*, the bonding wires 830*a*, 830*b*, and the conductive pads 840 to protect these components. In some embodiments, the material of the insulating encapsulation 860 is the same as the materials of the insulating encapsulation 140/140*a*, and thus is not repeated herein for simplicity. In one embodiment, the material of the insulating encapsulation 860 is different from the materials of the insulating encapsulation 140/140*a*, the disclosure is not limited thereto.

In some embodiments, interconnects (not shown) or through insulator vias (not shown) embedded in the substrate 810 may be used to provide electrical connection between the conductive pads 840 and the conductive pads 850 (such as bonding pads) that are located on another surface (e.g. a surface 810*b* opposite to the surface 810*a* along the direction Z) of the substrate 810. In certain embodiments, some of the conductive pads 850 are electrically connected to the semiconductor dies 820*a* and 820*b* through these insulator vias or interconnects (not shown) in addition to some of the conductive pads 840 and the bonding wires 830*a*, 830*b*.

In some embodiments, conductive elements 870 are disposed on the conductive pads 850 and over the surface 810*b* of the substrate 810. The formation and material of the conductive elements 870 may be the same or similar to the formation and material of the conductive elements 170 or the formation and material of the conductive elements 180*a*, and thus are not repeated herein for simplicity. As shown in FIG. 9, for example, the conductive elements 180*a* of the package structure 10*a* is bonded to the conductive elements 870 of the semiconductor package 800, and thus joints 300*a* are formed, in the package structure SP1, to electrically connect the semiconductor die 130 to the semiconductor dies 820*a*, 820*b*. In some embodiments, the joints 300*a* are located between the solder resist layer 110*a* and the substrate 810. In other words, the semiconductor dies 820*a*, 820*b* of the semiconductor package 800 are electrically connected to the semiconductor die 130 of the package structure 10*a* through the bonding wires 830*a* and 830*b*, the conductive pads 840, 850 disposed on the substrate 810, the joints 300*a* (including the conductive elements 870 and 180*a*), the conductive pillars 120, and the redistribution circuit structure 150.

In addition, an underfill (not shown) may be optimally formed to wrap around sidewalls of the joints 300*a*. The underfill may further fill up the gaps between the solder resist layer 110*a* of the package structure 10*a* and the substrate 810 of the semiconductor package 800, for example. The underfill may be any acceptable material, such as a polymer, epoxy, molding underfill, or the like, for example. In one embodiment, the underfill may be formed by underfill dispensing or any other suitable method. Owing to the underfill, the bonding strength between the package structure 10*a* and the semiconductor package 800 are enhanced, thereby improving the reliability of the package structure SP1 depicted FIG. 9.

Figure 10:
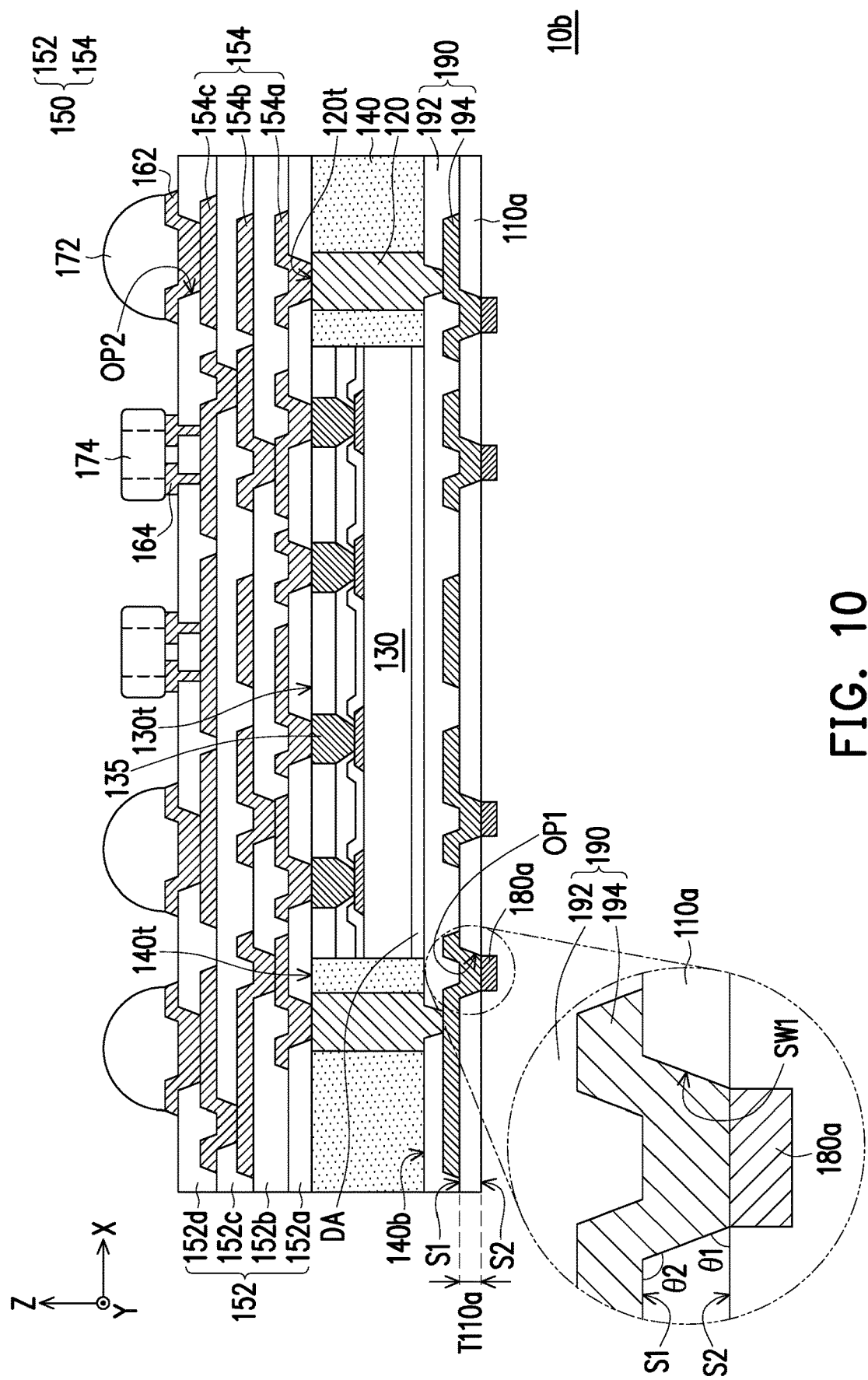
FIG. 10 is a schematic cross sectional view of a package structure in accordance with some embodiments of the disclosure.
Figure 11:
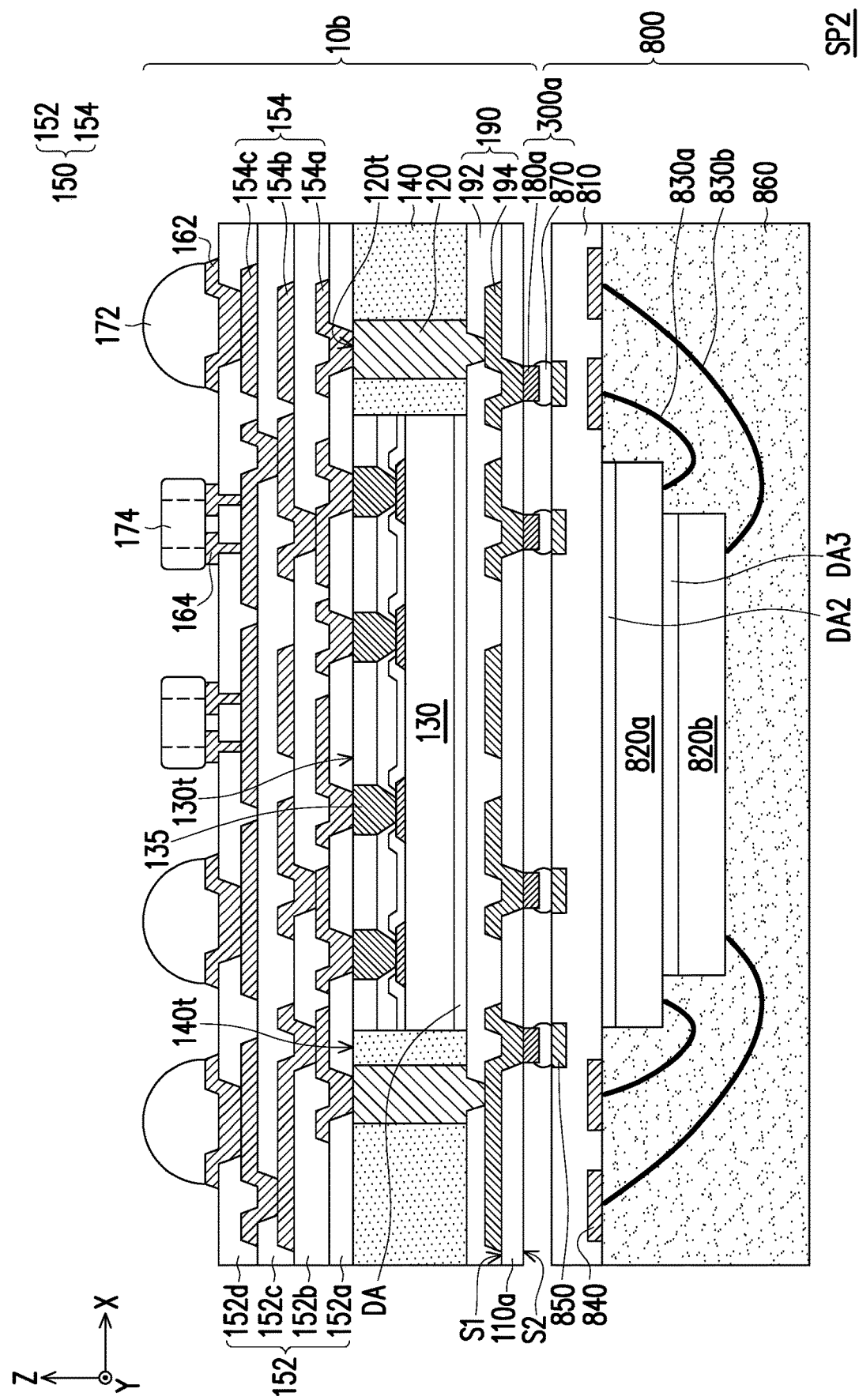
FIG. 11 is a schematic cross sectional view of a package structure in accordance with some embodiments of the disclosure.

FIG. 10 is a schematic cross sectional view of a package structure in accordance with some embodiments of the disclosure. FIG. 11 is a schematic cross sectional view of a package structure in accordance with some embodiments of the disclosure. Referring to FIG. 8 and FIG. 10 together, the semiconductor package structure 10*a* depicted in FIG. 8 and a semiconductor package structure 10*b* depicted in FIG. 10 are similar, the difference is that an additional element, e.g. a redistribution circuit structures 190, is further included in the semiconductor package structure 10*b*. The elements similar to or substantially the same as the elements described previously will use the same reference numbers, and certain details or descriptions (e.g. the materials, formation processes, positioning configurations, etc.) of the same elements would not be repeated herein. With the embodiments of which the redistribution circuit structure 190 is included, the redistribution circuit structure 190 is formed prior to the formation of the conductive pillars 120 and after the formation of the solder resist layer 110*a*.

In some embodiments, the redistribution circuit structure 190 is located on the surface S1 of the solder resist layer 110*a* and a bottom surface 140*b* of the insulating encapsulation 140. Along the direction Z, the bottom surface 140*b* of the insulating encapsulation 140 is opposite to the top surface 140*t* of the insulating encapsulation 140. In some embodiments, the redistribution circuit structure 190 is electrically connected to the conductive pillars 120, is electrically connected to the redistribution circuit structure 150 through the conductive pillars 120, and is electrically connected to the semiconductor die 130 through the conductive pillars 120, the redistribution circuit structure 150, and the connecting vias 135. In some embodiments, through the conductive pillars 120, the redistribution circuit structure 150 and the UBM patterns 162, the redistribution circuit structure 190 is further electrically connected to at least one of the conductive elements 172. In some embodiments, through the conductive pillars 120, the redistribution circuit structure 150 and the contact pads 164, the redistribution circuit structure 190 is further electrically connected to at least one of the semiconductor devices 174. In some embodiments, the redistribution circuit structure 190 is electrically connected to the conductive elements 180*a*. In such embodiments, the semiconductor die 130 is electrically connected to at least some of the conductive elements 180*a* through the redistribution circuit structure 150, the conductive pillars 120 and the redistribution circuit structure 190. As shown in FIG. 10, for example, the redistribution circuit structure 190 is referred to as a back-side redistribution layer of the semiconductor die 130.

In some embodiments, the formation of the redistribution circuit structure 190 includes sequentially forming one or more dielectric layers 192 and one or more metallization layers 194 in alternation. For illustrative purposes, as shown in FIG. 10, the redistribution circuit structure 190 includes one dielectric layer 192 and one metallization layer 194. It is appreciated that the redistribution circuit structure 190 is not limited to include one dielectric layer 192 and one metallization layer 194. The number of the dielectric layer 192 and the number of the metallization layer 194 may be more than one based on the demand and the design layout. In some embodiments, the metallization layer 194 is located on the solder resist layer 110*a*; the dielectric layer 192 is located on the metallization layer 194; and the conductive pillars 120, the semiconductor die 130 and the insulating encapsulation 140 are located on the dielectric layer 192. For example, as shown in FIG. 10, the conductive pillars 120 individually penetrate the dielectric layer 192 to electrically connect to the metallization layer 194, and the metallization layer 194 penetrate the solder resist layer 110a to electrically connect to the conductive elements 180a. That is, the conductive elements 180a are, via the redistribution circuit structure 190, electrically connected to the conductive pillars 120.

In some embodiments, the material and formation of the dielectric layer 192 may be the same as the material and formation of the dielectric layers 152, and the material and formation of the metallization layer 194 may be the same as the material and formation of the metallization layers 154, thus is not repeated herein. In an alternative embodiment, the material of the dielectric layer 192 may be the same as or different from the material of the dielectric layers 152. In an alternative embodiment, the material of the metallization layer 194 may be the same as or different from the material of the metallization layers 154. The disclosure is not limited thereto. In some alternative embodiments, a seed layer (not shown) may be formed between the metallization layer 194 and the solder resist layer 110a underlying thereto. In some embodiments, the seed layer may be referred to as a metal layer, which may be a single layer or a composite layer comprising a plurality of sub-layers formed of different materials. In some embodiments, a material of the seed layer may include titanium, copper, molybdenum, tungsten, titanium nitride, titanium tungsten, combinations thereof, or the like. For example, the seed layer may include a titanium layer and a copper layer over the titanium layer. In some embodiments, the seed layer may be formed using, for example, sputtering, physical vapor deposition (PVD), or the like.

In alternative embodiments, the package structure 10a in the package structure SP1 may be replaced with the package structure 10b of FIG. 10, see a package structure SP2 depicted in FIG. 11. In some embodiments, as shown in FIG. 11, for the package structure SP2, the semiconductor package 800 is bonded to the semiconductor package structure 10b depicted in FIG. 10 by connecting the conductive elements 870 and the conductive elements 180a (e.g. forming the joints 300a). In such embodiments, the semiconductor dies 820a, 820b of the semiconductor package 800 are electrically connected to the semiconductor die 130 of the package structure 10b through the bonding wires 830a and 830b, the conductive pads 840 and 850 disposed on the substrate 810, the joints 300a (including the conductive elements 870 and 180a), the redistribution circuit structure 190, the conductive pillars 120, and the redistribution circuit structure 150.

Figure 12:
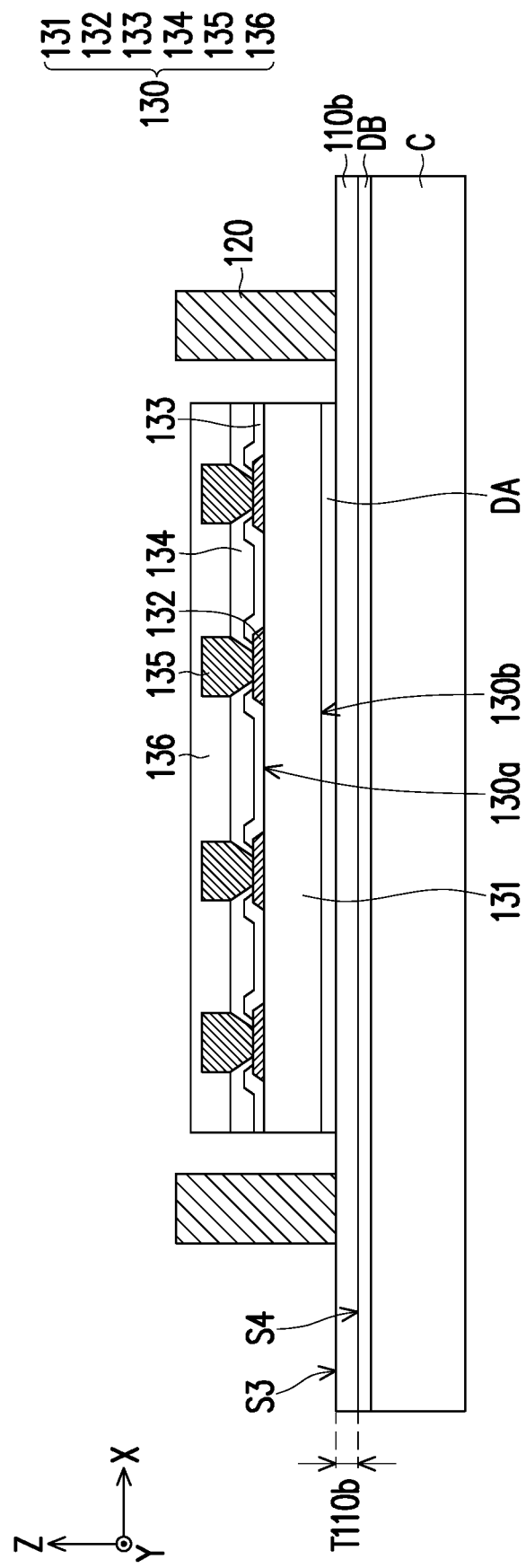
FIG. 12 to FIG. 14 are schematic cross sectional views of various stages in a manufacturing method of a package structure in accordance with some embodiments of the disclosure.
Figure 13:
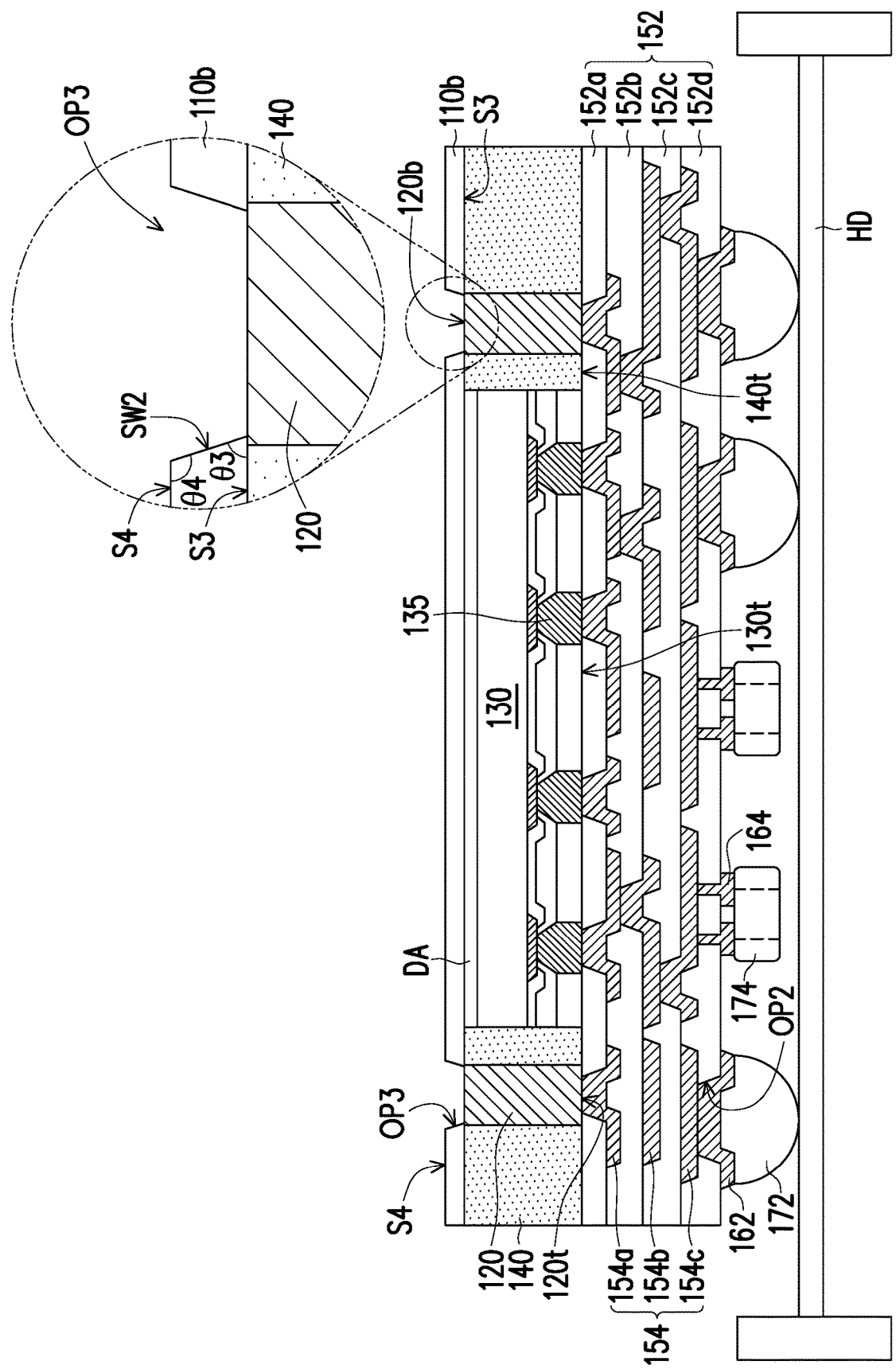
Figure 14:
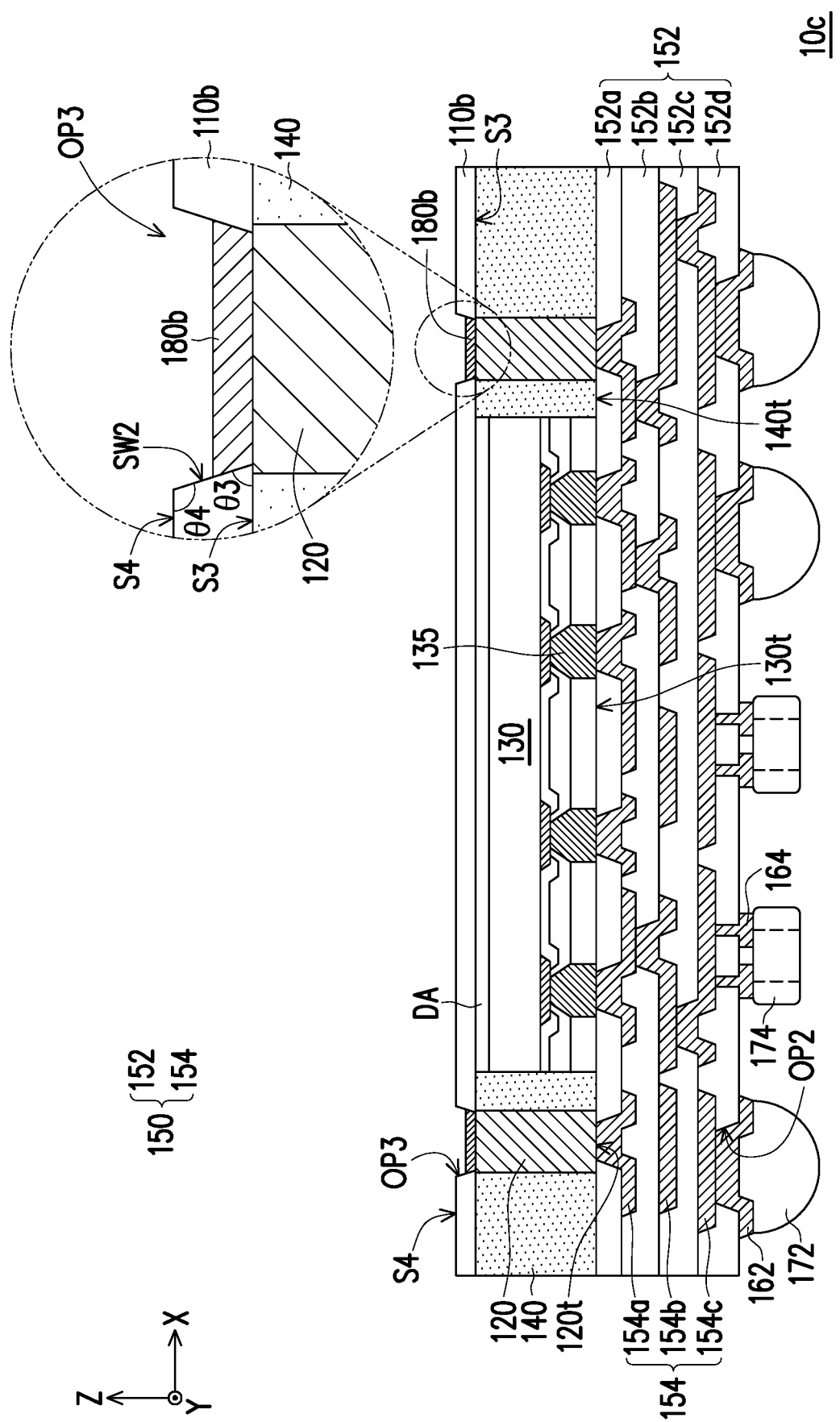
Figure 15:
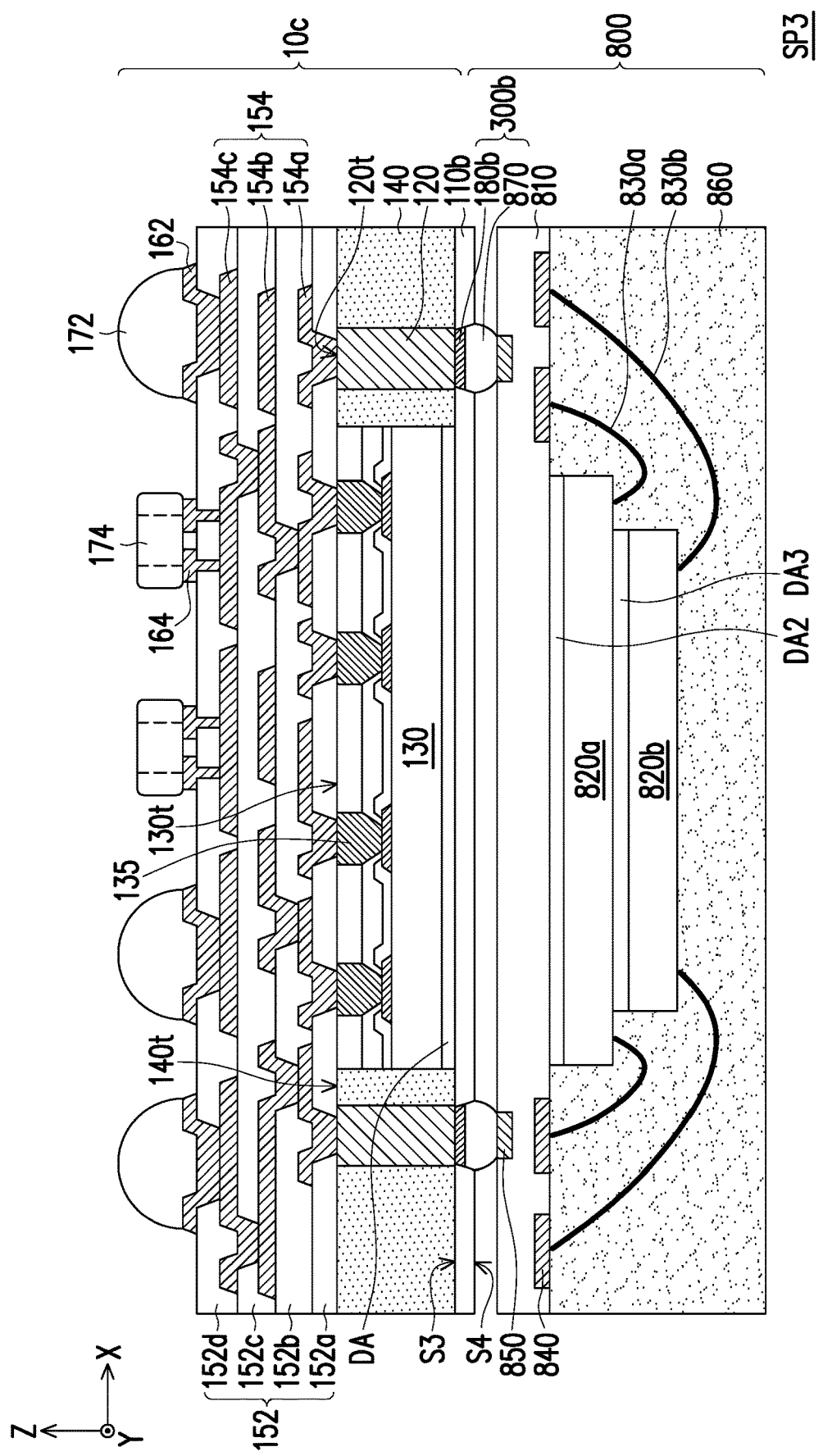
FIG. 15 is a schematic cross sectional view of a package structure in accordance with some embodiments of the disclosure.

FIG. 12 to FIG. 14 are schematic cross sectional views of various stages in a manufacturing method of a package structure in accordance with some embodiments of the disclosure. FIG. 15 is a schematic cross sectional view of a package structure in accordance with some embodiments of the disclosure. The elements similar to or substantially the same as the elements described previously will use the same reference numbers, and certain details or descriptions (e.g. the materials, formation processes, positioning configurations, etc.) of the same elements would not be repeated herein.

Referring in FIG. 12, in some embodiments, a carrier C with a debond layer DB and a solder resist layer 110b coated thereon is provided. For example, the debond layer DB is located between the carrier C and the solder resist layer 110b. The material of the carrier C and the formation and material of the debond layer DB have been described in FIG. 1, and thus are not repeating herein for simplicity. In the disclosure, the formation and material of the solder resist layer 110b is similar to the formation and the material of the solder resist layer 110a described in FIG. 1, however, the solder resist layer 110b is non-photosensitive. In some embodiments, a thickness T110b of the solder resist layer 110b is approximately from 10 µm to 30 µm. Due to the solder resist layer 110b (e.g. the low CTE value) in addition to its specific thickness range, better warpage control (e.g., warpage being less than or substantially equal to 80 µm at room temperature and being greater than or substantially equal to −80 µm) to the package structure 10c is achieve.

Thereafter, in some embodiments, at least one conductive pillar 120 and at least one semiconductor die 130 are formed on the solder resist layer 110b (e.g. on a surface S3 of the solder resist layer 110b). For illustrative purposes, the at least one conductive pillar 120 include a plurality of conductive pillars 120 (e.g. two conductive pillars 120), and at least one semiconductor die 130 include one semiconductor die 130; however, the disclosure is not limited thereto. The formation and material of the conductive pillars 120 and the formation and material of the semiconductor die 130 have been described in FIG. 1, and thus are not repeating herein for simplicity. In some embodiments, the conductive pillars 120 and the semiconductor die 130 are arranged side-by-side on the solder resist layer 110b along the X-Y plane. Due to the solder resist layer 110b is non-photosensitive, no opening OP1 is formed in the solder resist layer 110b prior to the formations of conductive pillars 120 and the semiconductor die 130.

Referring to FIG. 13, in some embodiments, the previously described manufacturing process as described in FIG. 3 to FIG. 7 and a subsequent patterning process are performed on the structure depicted in FIG. 12. For example, by performing the previously described manufacturing process as described in FIG. 3 to FIG. 7 on the structure depicted in FIG. 12, the carrier C and the debond layer DB are removed from the solder resist layer 110b, where a surface S4 of the solder resist layer 110b is exposed. The surface S4 is opposite to the surface S3 along the direction Z.

Thereafter, in some embodiments, the exposed solder resist layer 110b is then patterned to form a plurality of openings OP3 therein. The patterning process, for example, includes a laser drill process. For example, only two openings OP3 are shown in FIG. 13 for illustrative purposes; however, the number of the openings OP3 may be more than two based on the demand and the design layout. Additionally, for example, on the X-Y plane, dimensions (e.g. maximum widths) of the openings OP3 may be the same, however the disclosure is not limited thereto. In an alternative embodiment, according to the design layout and/or demand, the dimensions of the openings OP3 may be the different from each other or may be different in a manner of different groups. In one embodiment, on the X-Y plane, a cross-sectional shape of the openings OP3 individually may be round, elliptical, oval, tetragonal, octagonal or any suitable polygonal shape; the disclosure is not limited thereto. As illustrated in FIG. 13, after patterning the solder resist layer 110b, the bottom surfaces 120b of the conductive pillars 120 are exposed by the openings OP3. As shown in FIG. 13, for example, the openings OP3 are not filled with the conductive pillars 120, where the surfaces 120b of the conductive pillars 120 are substantially coplanar with the surface S3 of the solder resist layer 110b. That is, the conductive pillars 120 are not extended into the openings OP3. In the solder resist layer 110b shown in FIG. 13, an angle θ3 between the surface S3 of the solder resist layer 110b and a sidewall SW2 of each opening OP3 is approximately 40 degrees to 60 degrees, and an angle θ4 (i.e. θ4=180 degrees-θ3) between the surface S4 of the solder resist layer 110b and the sidewall SW2 of each opening OP3 is 120 degrees to 140 degrees. With the formation of the solder resist layer 110b having the openings OP3, the manufacturing cost is further reduced.

Referring to FIG. 14, in some embodiments, a plurality of conductive elements 180b are formed on the bottom surfaces 120b of the conductive pillars 120 and in the openings OP3. For example, the bottom surfaces 120b of the conductive pillars 120 exposed by the solder resist layer 110a are covered by the conductive elements 180b. The formation and material of the conductive elements 180b is similar to the formation and material of the conductive elements 180a described in FIG. 8, and thus are not repeated herein. In the disclosure, the conductive elements 180b may also be referred to as conductive terminals for electrical connection to external elements (e.g. an additional semiconductor package/device, a circuit substrate, etc.). As shown in FIG. 14, the conductive elements 180b are formed inside of the openings OP3 and covered the surfaces 120b of the conductive pillars 120. That is, the conductive elements 180b are rest at a first plane where the surface S3 of the solder resist layer 110a located at and are protruding from the first plane towards a second plane where the surface S4 located at.

In some embodiments, after forming the conductive elements 180b, the conductive elements 172 are released from the holding device HD to form the package structure 10c. In some embodiments, a dicing (singulating) process is performed to cut a plurality of the package structures 10c interconnected therebetween into individual and separated package structures 10c before releasing the conductive elements 172 from the holding device HD. In one embodiment, the dicing process is a wafer dicing process including mechanical blade sawing or laser cutting. Up to here, the manufacture of the package structure 10c is completed. The package structure 10c depicted in FIG. 14 may be referred to as an integrated fan-out (semiconductor) package structure having dual-side terminals.

In some alternative embodiments, the package structure 10c may be further mounted with a circuit substrate, an interposer, an additional package, chips/dies or other electronic devices to form a stacked package structure or a package on package (PoP) structure through the conductive elements 172 and/or other the conductive elements 180b based on the design layout and the demand. For example, the package structure 10c of FIG. 14 is bonded to a semiconductor package 800 to form a package structure SP3, as shown in FIG. 15.

Referring to FIG. 15, for the package structure SP3, the semiconductor package 800 is bonded to the semiconductor package structure 10c depicted in FIG. 14 by connecting the conductive elements 870 and the conductive elements 180b (e.g. forming the joints 300b), for example. In some embodiments, a portion of each of the joints 300b is located in the openings OP3. In such embodiments, the semiconductor dies 820a, 820b of the semiconductor package 800 are electrically connected to the semiconductor die 130 of the package structure 10c through the bonding wires 830a and 830b, the conductive pads 840 and 850 disposed on the substrate 810, the joints 300b (including the conductive elements 870 and 180b), the conductive pillars 120, and the redistribution circuit structure 150.

Figure 16:
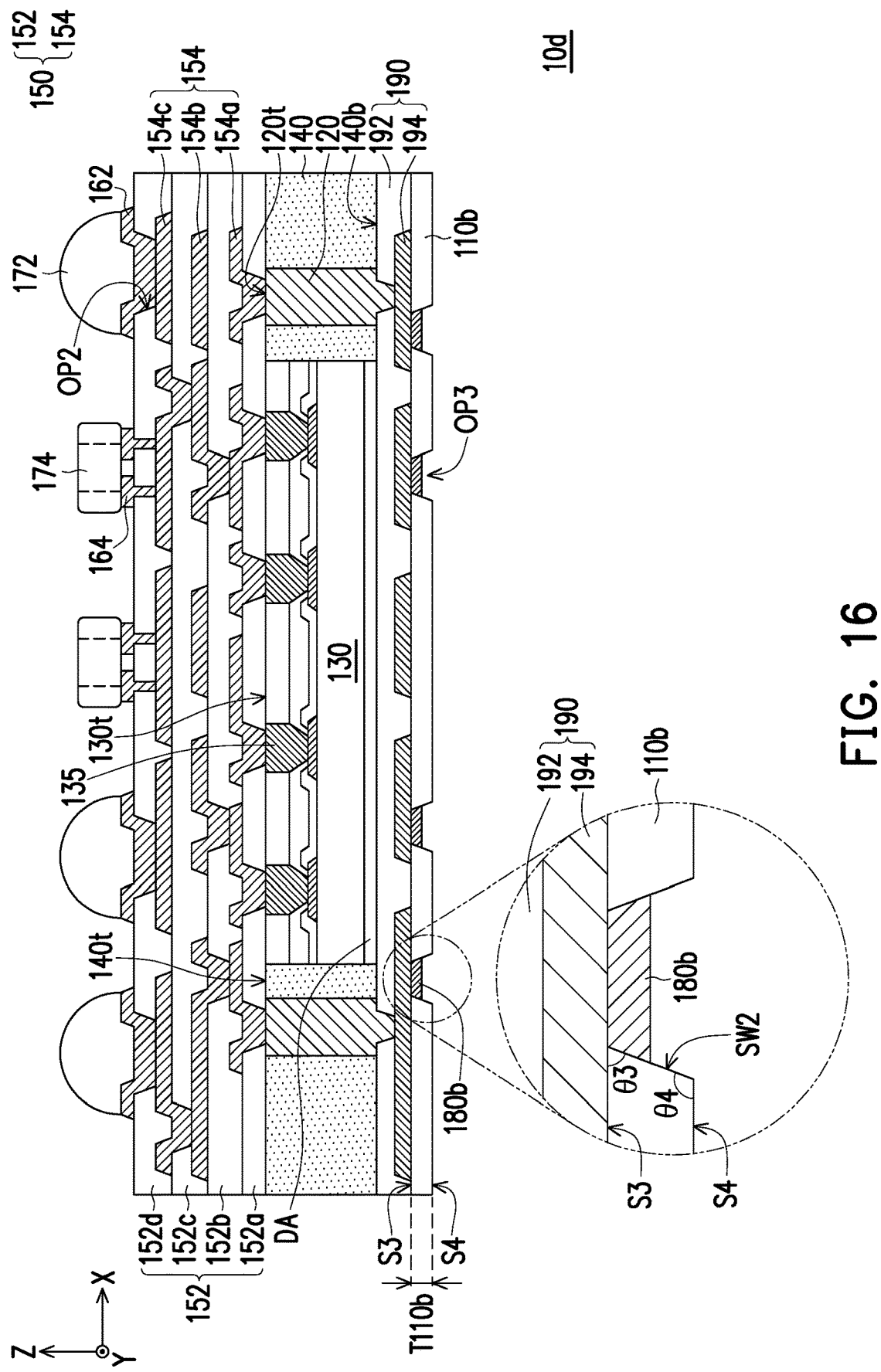
FIG. 16 is a schematic cross sectional view of a package structure in accordance with some embodiments of the disclosure.
Figure 17:
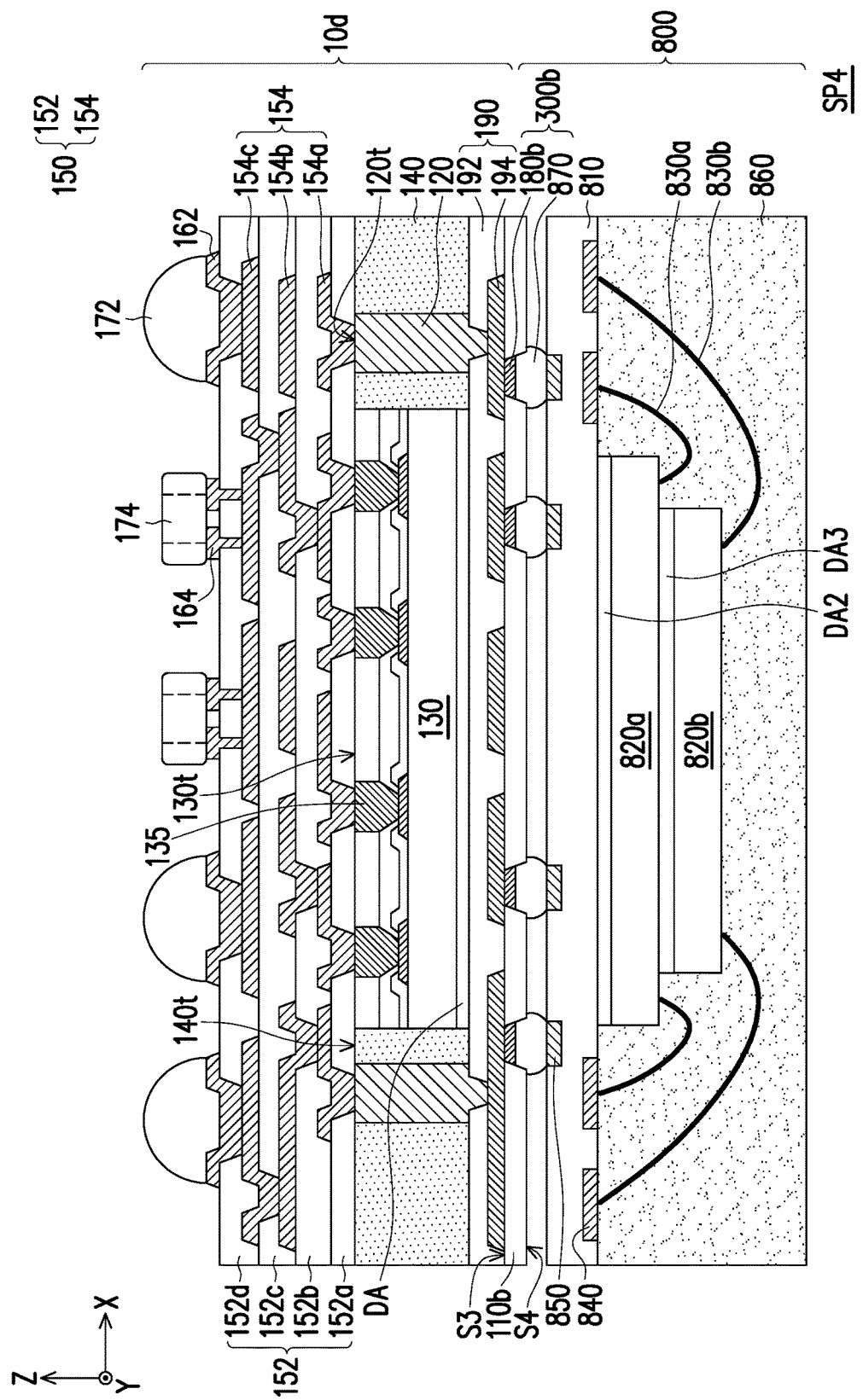
FIG. 17 is a schematic cross sectional view of a package structure in accordance with some embodiments of the disclosure.

FIG. 16 is a schematic cross sectional view of a package structure in accordance with some embodiments of the disclosure. FIG. 17 is a schematic cross sectional view of a package structure in accordance with some embodiments of the disclosure. Referring to FIG. 14 and FIG. 16 together, the semiconductor package structure 10c depicted in FIG. 14 and a semiconductor package structure 10d depicted in FIG. 16 are similar, the difference is that an additional element, e.g. a redistribution circuit structures 190, is further included in the semiconductor package structure 10d. The elements similar to or substantially the same as the elements described previously will use the same reference numbers, and certain details or descriptions (e.g. the materials, formation processes, positioning configurations, etc.) of the same elements would not be repeated herein.

With the embodiments of which the redistribution circuit structure 190 is included, the redistribution circuit structure 190 is formed prior to the formation of the conductive pillars 120 and after the formation of the solder resist layer 110b. The formation and material of the redistribution circuit structure 190 has been described in FIG. 10, and thus are not repeating herein for simplicity. In some embodiments, the redistribution circuit structure 190 is located on the surface S3 of the solder resist layer 110b and a bottom surface 140b of the insulating encapsulation 140. Similar to the redistribution circuit structure 190 of the package structure 10b described in FIG. 10 that providing routing function, for example, the redistribution circuit structure 190 is also referred to as a back-side redistribution layer of the semiconductor die 130 of the package structure 10d depicted in FIG. 16. That is, the redistribution circuit structure 190 also provided routing function to the semiconductor die 130 with other conductive components inside the package structure 10d similar to the redistribution circuit structure 190 of the package structure 10b.

In some alternative embodiments, the package structure 10d may be further mounted with a circuit substrate, an interposer, an additional package, chips/dies or other electronic devices to form a stacked package structure or a package on package (PoP) structure through the conductive elements 172 and/or other the conductive elements 180b based on the design layout and the demand. For example, the package structure 10d of FIG. 16 is bonded to a semiconductor package 800 to form a package structure SP4, as shown in FIG. 17. The detail of the semiconductor package 800 is described in FIG. 9, and thus is not repeated herein. In some embodiments, as shown in FIG. 17, for the package structure SP4, the semiconductor package 800 is bonded to the semiconductor package structure 10d depicted in FIG. 16 by connecting the conductive elements 870 and the conductive elements 180b (e.g. forming the joints 300b). In such embodiments, the semiconductor dies 820a, 820b of the semiconductor package 800 are electrically connected to the semiconductor die 130 of the package structure 10d through the bonding wires 830a and 830b, the conductive pads 840 and 850 disposed on the substrate 810, the joints 300b (including the conductive elements 870 and 180b), the redistribution circuit structure 190, the conductive pillars 120, and the redistribution circuit structure 150.

In accordance with some embodiments, a package structure includes a semiconductor die, conductive pillars, an insulating encapsulation, a redistribution circuit structure, and a solder resist layer. The conductive pillars are arranged aside of the semiconductor die. The insulating encapsulation encapsulates the semiconductor die and the conductive pillars, and the insulating encapsulation has a first surface and a second surface opposite to the first surface. The redistribution circuit structure is located on the first surface of the insulating encapsulation. The solder resist layer is located on the second surface of the insulating encapsulation, wherein a material of the solder resist layer includes a filler.

In accordance with some embodiments, a package structure includes a semiconductor die, an insulating encapsulation, a first redistribution circuit structure, and a solder resist layer. The semiconductor die has a front surface and a rear surface opposite to the front surface. The insulating encapsulation laterally encapsulates the semiconductor die. The first redistribution circuit structure is located on the front surface of the semiconductor die. The solder resist layer is located over the rear surface of the semiconductor die, wherein a material of the solder resist layer comprises a filler.

In accordance with some embodiments, a method of manufacturing package structure includes the following steps, providing a carrier; forming a solder resist layer with a material comprising a filler on the carrier; disposing a semiconductor die and conductive pillars on the solder resist layer; encapsulating the semiconductor die and the conductive pillars in the insulating encapsulation; forming a first redistribution circuit structure on the insulating encapsulation; disposing first conductive element over the conductive pillars, the conductive pillars being between the first redistribution circuit structure and the first conductive elements; and disposing second conductive elements on the first redistribution circuit structure, the first redistribution circuit structure being between the insulating encapsulation and the second conductive elements.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a semiconductor die;
   conductive pillars, arranged aside of the semiconductor die;
   an insulating encapsulation, encapsulating the semiconductor die and the conductive pillars, the insulating encapsulation having a first surface and a second surface opposite to the first surface, and wherein the conductive pillars penetrate through the insulating encapsulation;
   a redistribution circuit structure, located on the first surface of the insulating encapsulation;
   a solder resist layer, located on the second surface of the insulating encapsulation, wherein the solder resist layer is photosensitive, and a material of the solder resist layer comprises a filler;
   first conductive elements, disposed on an outermost surface of the solder resist layer and electrically coupled to the conductive pillars;
   second conductive elements, disposed on and electrically coupled to the redistribution circuit structure; and
   at least one semiconductor device, disposed on and electrically coupled to the redistribution circuit structure, wherein the second conductive elements and the at least one semiconductor device are disposed on a side of the redistribution circuit structure.

2. The package structure of claim 1, wherein a thickness of the solder resist layer ranges from 10 μm to 30 μm along a stacking direction of the redistribution circuit structure, the insulating encapsulation, and the solder resist layer,
   wherein a particle diameter of the filler is approximately from 0.2 μm to 2 μm.

3. The package structure of claim 1, wherein the solder resist layer comprises contact openings, and a surface of each of the conductive pillars is coplanar to a third surface of the solder resist layer, wherein the third surface of the solder resist layer is farther from the second surface of the insulating encapsulation than a fourth surface of the solder resist layer is, and the fourth surface is opposite to the third surface.

4. The package structure of claim 3, wherein an angle between the third surface of the solder resist layer and a sidewall of each of the contact openings ranges from 60 degrees to 80 degrees.

5. The package structure of claim 3, wherein the first conductive elements are disposed outside the contact openings and on the surfaces of the conductive pillars coplanar to the third surface of the solder resist layer.

6. The package structure of claim 1, wherein the material of the solder resist layer further comprises an epoxy-based resin, and a weight percentage ratio of the epoxy-based resin to the filler is from 40:60 to 60:40.

7. The package structure of claim 1, wherein the redistribution circuit structure is between the second conductive elements and the insulating encapsulation.

8. The package structure of claim 1, wherein a portion of a sidewall of each of conductive pillars being encapsulated by the insulating encapsulation is planar.

9. The package structure of claim 1, further comprising:
   a sub-package located on the solder resist layer, the sub-package comprising at least one memory die; and
   joints, sandwiched between and electrically connecting the conductive pillars and the sub-package.

10. The package structure of claim 1, further comprising a die attach film between the semiconductor die and the solder resist layer.

11. A package structure, comprising:
    a semiconductor die having a front surface and a rear surface opposite to the front surface, the semiconductor die comprising a plurality of vias on the front surface and a protection layer laterally covering the plurality of vias and standing on the front surface;
    an insulating encapsulation, laterally encapsulating the semiconductor die, wherein the plurality of vias are separated from the insulating encapsulation by the protection layer;
    a first redistribution circuit structure, located on the front surface of the semiconductor die;
    a solder resist layer, located over the rear surface of the semiconductor die, wherein the solder resist layer is photosensitive;
    first conductive elements, disposed on an outermost surface of the solder resist layer and electrically coupled to the semiconductor die;
    second conductive elements, disposed on and electrically coupled to the first redistribution circuit structure; and
    at least one semiconductor device, disposed on and electrically couple to the first redistribution circuit structure, wherein the second conductive elements and the at least one semiconductor device are disposed on a side of the first redistribution circuit structure.

12. The package structure of claim 11, further comprising:
conductive pillars, located aside of the semiconductor die and laterally encapsulated in the insulating encapsulation, wherein the conductive pillars are electrically connected to the first redistribution circuit structure, and the conductive pillars penetrate through the insulating encapsulation,
wherein the first conductive elements are located on and electrically connected to the conductive pillars, wherein the conductive pillars are between the first redistribution circuit structure and the first conductive elements,
wherein the first redistribution circuit structure is between the second conductive elements and the insulating encapsulation, and
wherein the first conductive elements are electrically connected to the semiconductor die through the conductive pillars and the first redistribution circuit structure, and the second conductive elements are electrically connected to the semiconductor die through the first redistribution circuit structure.

13. The package structure of claim 12, wherein a portion of a sidewall of each of conductive pillars is in contact with the insulating encapsulation and is planar, wherein sidewalls of the conductive pillars are step-shaped.

14. The package structure of claim 12, further comprising:
a second redistribution circuit structure, located on the rear surface of the semiconductor die and between the insulating encapsulation and the solder resist layer, wherein the first conductive elements are electrically connected to the semiconductor die through the second redistribution circuit structure, the conductive pillars, and the first redistribution circuit structure.

15. The package structure of claim 11, wherein a thickness of the solder resist layer ranges from 10 μm to 30 μm along a stacking direction of the first redistribution circuit structure, the insulating encapsulation, and the solder resist layer,
wherein a particle diameter of the filler is approximately from 0.2 μm to 2 μm.

16. The package structure of claim 12, further comprising:
a sub-package located on the solder resist layer, the sub-package comprising at least one memory die;
joints, sandwiched between and electrically connecting the conductive pillars and the sub-package; and
an underfill, disposed in a gap between the solder resist layer and the sub-package and wrapping around sidewalls of the joints.

17. A method of manufacturing a package structure, comprising:
providing a carrier;
forming a solder resist layer with a material comprising a filler on the carrier, wherein the solder resist layer is photosensitive;
disposing a semiconductor die and conductive pillars on the solder resist layer;
encapsulating the semiconductor die and the conductive pillars in the insulating encapsulation, and the conductive pillars penetrating through the insulating encapsulation;
forming a first redistribution circuit structure on the insulating encapsulation;
disposing first conductive elements over an outermost surface of the solder resist layer, the first conductive elements being electrically coupled to the conductive pillars, the conductive pillars being between the first redistribution circuit structure and the first conductive elements;
disposing second conductive elements on the first redistribution circuit structure, the second conductive elements being electrically coupled to the first redistribution circuit structure, and first redistribution circuit structure being between the insulating encapsulation and the second conductive elements; and
disposing at least one semiconductor device on the first redistribution circuit structure, the at least one semiconductor device being electrically coupled to the first redistribution circuit structure, wherein the second conductive elements and the at least one semiconductor device are disposed on a side of the first redistribution circuit structure.

18. The method of claim 17, after forming the solder resist layer and prior to disposing the semiconductor die and the conductive pillars on the solder resist layer, further comprising patterning the solder resist layer to form contact openings by photolithography, wherein the conductive pillars are formed to be partially located in the contact openings,
wherein prior to disposing the first conductive elements over the conductive pillars, the carrier is debonded from the solder resist layer, and the first conductive elements are located outside of the contact openings and on the conductive pillars.

19. The method of claim 18, prior to disposing the first conductive elements, wherein the method further comprises:
forming a second redistribution circuit structure over the solder resist layer, the second redistribution circuit structure electrically connects the conductive pillars and the first conductive elements.

20. The method of claim 17, further comprising:
mounting a sub-package with third conductive elements on the semiconductor die by connecting the first conductive elements and the third conductive elements to form joints; and
dispensing an underfill in a gap between the sub-package and the solder resist layer to cover sidewalls of the joints.

* * * * *